(12) United States Patent
Klein

(10) Patent No.: US 11,602,083 B2
(45) Date of Patent: Mar. 7, 2023

(54) COMPUTER SERVER HEAT REGULATION UTILIZING INTEGRATED PRECISION AIR FLOW

(71) Applicant: DHK Storage, LLC, Sterling, VA (US)

(72) Inventor: David Klein, Sterling, VA (US)

(73) Assignee: DHK Storage, Inc., Herndon, VA (US)

( * ) Notice: Subject to any disclaimer, the term of this patent is extended or adjusted under 35 U.S.C. 154(b) by 0 days.

(21) Appl. No.: 16/840,313

(22) Filed: Apr. 3, 2020

(65) Prior Publication Data

US 2020/0236815 A1    Jul. 23, 2020

Related U.S. Application Data

(63) Continuation of application No. 16/577,886, filed on Sep. 20, 2019, now Pat. No. 11,178,794, which is a continuation of application No. 15/792,663, filed on Oct. 24, 2017, now Pat. No. 10,426,061, which is a continuation of application No. 15/144,788, filed on May 2, 2016, now Pat. No. 9,832,912.

(60) Provisional application No. 62/158,529, filed on May 7, 2015.

(51) Int. Cl.
| | |
|---|---|
| *H05K 7/20* | (2006.01) |
| *F16K 3/03* | (2006.01) |
| *F16K 3/02* | (2006.01) |
| *F16K 27/00* | (2006.01) |
| *H01L 35/28* | (2006.01) |
| *F16K 11/10* | (2006.01) |
| *A62C 37/40* | (2006.01) |

(52) U.S. Cl.
CPC ....... *H05K 7/20745* (2013.01); *F16K 3/0209* (2013.01); *F16K 3/03* (2013.01); *F16K 27/00* (2013.01); *H01L 35/28* (2013.01); *H05K 7/20145* (2013.01); *H05K 7/20181* (2013.01); *H05K 7/20727* (2013.01); *H05K 7/20736* (2013.01); *A62C 37/40* (2013.01); *F15B 2211/4053* (2013.01); *F16K 11/10* (2013.01); *F16K 27/003* (2013.01); *H05K 7/20836* (2013.01)

(58) Field of Classification Search
CPC  H05K 7/20554–2059; H05K 7/20718–20745; H05K 16/841; H05K 7/678
See application file for complete search history.

(56) References Cited

U.S. PATENT DOCUMENTS

| | | | |
|---|---|---|---|
| 3,192,306 A * | 6/1965 | Skonnord | H05K 7/20572 |
| | | | 174/16.1 |
| 4,535,386 A | 8/1985 | Frey, Jr. et al. | |
| 4,644,443 A | 2/1987 | Swensen et al. | |
| 4,672,509 A | 6/1987 | Speraw | |
| 4,774,631 A | 9/1988 | Okuyama et al. | |
| 4,860,163 A | 8/1989 | Sarath | |
| 5,287,244 A | 2/1994 | Hileman et al. | |

(Continued)

*Primary Examiner* — Robert J Hoffberg
(74) *Attorney, Agent, or Firm* — Da Vinci's Notebook, LLC

(57) ABSTRACT

Disclosed is system, method, and rack stand portion for the advantageous cooling of computer equipment. The rack stand includes a hollow body that may be formed of cartridges. Gas from an airflow source is guided into the rack stand body and then into a sealed case of the computer equipment. Air flow is then guided out of the computer equipment for recirculation, exhaust, or other purpose.

6 Claims, 43 Drawing Sheets

(56) References Cited

U.S. PATENT DOCUMENTS

| | | | |
|---|---|---|---|
| 5,505,533 A | 4/1996 | Kammersqard | |
| 6,164,369 A | 12/2000 | Stoller | |
| 6,305,180 B1 | 10/2001 | Miller et al. | |
| 6,310,783 B1 | 10/2001 | Winch | |
| 6,494,050 B2 | 12/2002 | Spinazzola | |
| 6,501,020 B2 | 12/2002 | Grant | |
| 6,535,382 B2 | 3/2003 | Bishop | |
| 6,590,768 B1* | 7/2003 | Wiley | G06F 1/183 257/E23.099 |
| 6,594,148 B1 | 7/2003 | Nguyen | |
| 6,611,428 B1 | 8/2003 | Wong | |
| 6,819,563 B1 | 11/2004 | Chu et al. | |
| 6,822,859 B2 | 11/2004 | Coglitore | |
| 6,909,603 B2* | 6/2005 | Wiley | G06F 1/183 257/E23.099 |
| 7,112,131 B2* | 9/2006 | Rasmussen | H05K 7/20736 454/184 |
| 7,144,320 B2 | 12/2006 | Turek | |
| 7,182,208 B2 | 2/2007 | Tachibana | |
| 7,315,448 B1 | 1/2008 | Bash | |
| 7,349,213 B2 | 3/2008 | Campbell | |
| 7,365,973 B2 | 4/2008 | Rasmussen | |
| 7,385,810 B2 | 6/2008 | Chu | |
| 7,464,563 B2 | 12/2008 | Park | |
| 7,492,591 B1 | 2/2009 | Aybay | |
| 7,508,663 B2 | 3/2009 | Coglitore | |
| 7,542,285 B2 | 6/2009 | Colucci | |
| 7,600,148 B1 | 10/2009 | Shaw | |
| 7,643,291 B2* | 1/2010 | Mallia | H05K 7/20745 361/695 |
| 7,685,465 B1 | 3/2010 | Shaw | |
| 7,768,780 B2 | 8/2010 | Coglitore | |
| 7,791,894 B2 | 9/2010 | Bechtolsheim | |
| 7,804,690 B2 | 9/2010 | Huang | |
| 7,813,129 B2 | 10/2010 | Vinson | |
| 7,878,888 B2* | 2/2011 | Rasmussen | H05K 7/20736 454/184 |
| 7,925,746 B1 | 4/2011 | Melton | |
| 8,004,839 B2 | 8/2011 | Sato | |
| 8,009,430 B2 | 8/2011 | Claassen | |
| 8,139,358 B2 | 3/2012 | Tambe | |
| 8,144,464 B2* | 3/2012 | VanDerVeen | H05K 7/20736 361/692 |
| 8,228,669 B2 | 7/2012 | Hu | |
| 8,403,736 B2* | 3/2013 | Rasmussen | H05K 7/20736 454/184 |
| 8,441,788 B2 | 5/2013 | Xu | |
| 8,520,385 B2 | 8/2013 | Chen | |
| 8,593,815 B2 | 11/2013 | Claassen | |
| 8,730,671 B2* | 5/2014 | VanDerVeen | H05K 7/20736 361/692 |
| 8,776,868 B2 | 7/2014 | Martin | |
| 8,789,384 B2 | 7/2014 | Eckberg | |
| 8,817,464 B2 | 8/2014 | Jau | |
| 8,848,382 B2 | 9/2014 | Qiu | |
| 8,854,815 B2* | 10/2014 | Tambe | G06F 1/20 361/695 |
| 8,854,822 B2 | 10/2014 | Hazzard | |
| 8,955,347 B2 | 2/2015 | Campbell | |
| 8,964,375 B2 | 2/2015 | Claassen | |
| 9,025,331 B2 | 5/2015 | Campbell | |
| 9,025,332 B2 | 5/2015 | Campbell | |
| 9,320,175 B2* | 4/2016 | Peng | H05K 7/20727 |
| 9,357,681 B2 | 5/2016 | Ross | |
| 9,795,063 B1* | 10/2017 | Klein | H05K 7/20736 |
| 9,832,912 B2* | 11/2017 | Klein | F16K 3/03 |
| 10,004,162 B2 | 7/2018 | Leigh | |
| 10,426,061 B2* | 9/2019 | Klein | F16K 27/00 |
| 10,709,038 B2* | 7/2020 | Klein | H01L 35/28 |
| 2002/0007643 A1 | 1/2002 | Spinazzola | |
| 2003/0235025 A1 | 12/2003 | Amaike | |
| 2004/0182799 A1 | 9/2004 | Tachibana | |
| 2004/0190270 A1 | 9/2004 | Aldag | |
| 2005/0068716 A1 | 3/2005 | Pereira | |
| 2006/0176664 A1 | 8/2006 | Casebolt | |
| 2007/0081888 A1 | 4/2007 | Harrison | |
| 2007/0089859 A1 | 4/2007 | Wei | |
| 2007/0187343 A1 | 8/2007 | Colucci | |
| 2007/0205297 A1 | 9/2007 | Finkam | |
| 2007/0211439 A1 | 9/2007 | Shimizu | |
| 2007/0245165 A1 | 10/2007 | Fung | |
| 2007/0291452 A1 | 12/2007 | Gilliland | |
| 2008/0037217 A1 | 2/2008 | Murakami | |
| 2008/0163628 A1 | 7/2008 | Lilke | |
| 2008/0174961 A1 | 7/2008 | Campbell | |
| 2008/0232064 A1 | 9/2008 | Sato | |
| 2008/0239688 A1 | 10/2008 | Casey | |
| 2009/0016019 A1 | 1/2009 | Bandholz | |
| 2009/0021907 A1 | 1/2009 | Mann | |
| 2009/0044027 A1 | 2/2009 | Piazza | |
| 2009/0138313 A1 | 5/2009 | Morgan | |
| 2009/0173473 A1 | 7/2009 | Day | |
| 2009/0190301 A1 | 7/2009 | Huang | |
| 2009/0219536 A1 | 9/2009 | Piazza | |
| 2009/0237876 A1 | 9/2009 | Suzuki | |
| 2009/0260874 A1 | 10/2009 | Eckberg | |
| 2009/0262501 A1 | 10/2009 | Classen | |
| 2009/0287866 A1 | 11/2009 | Mejias | |
| 2009/0308579 A1 | 12/2009 | Johnson | |
| 2009/0309570 A1 | 12/2009 | Lehmann | |
| 2010/0147490 A1 | 6/2010 | Campbell | |
| 2010/0172078 A1 | 7/2010 | Tanaka | |
| 2011/0063778 A1 | 3/2011 | Brouillard | |
| 2011/0069452 A1 | 3/2011 | Campbell | |
| 2011/0116233 A1 | 5/2011 | Beaudoin | |
| 2011/0222241 A1 | 9/2011 | Shearman | |
| 2012/0069514 A1 | 3/2012 | Ross | |
| 2013/0021746 A1 | 1/2013 | Campbell | |
| 2013/0065501 A1 | 3/2013 | Wang | |
| 2013/0306269 A1 | 11/2013 | Helbig | |
| 2014/0043752 A1 | 2/2014 | Julien-Roux | |
| 2014/0063729 A1 | 3/2014 | Claassen | |
| 2014/0071615 A1 | 3/2014 | Tong-Viet | |
| 2014/0168887 A1 | 6/2014 | Lai | |
| 2014/0168889 A1 | 6/2014 | Branton | |
| 2014/0216683 A1 | 8/2014 | Meyer | |
| 2014/0285965 A1 | 9/2014 | Keisling | |
| 2014/0355202 A1 | 12/2014 | LeCourtier | |
| 2015/0077930 A1 | 3/2015 | Kadotani | |
| 2018/0014433 A1* | 1/2018 | Klein | F16K 3/03 |
| 2019/0307023 A1* | 10/2019 | Marrs | H05K 7/20736 |
| 2020/0022287 A1* | 1/2020 | Klein | F16K 3/0209 |
| 2020/0022288 A1* | 1/2020 | Klein | H05K 7/20181 |
| 2020/0120834 A1* | 4/2020 | Kaiser | H05K 7/20181 |
| 2020/0178418 A1* | 6/2020 | Klein | H05K 7/20727 |
| 2020/0178419 A1* | 6/2020 | Klein | F16K 3/0209 |
| 2020/0178420 A1* | 6/2020 | Klein | H01L 35/28 |
| 2020/0178421 A1* | 6/2020 | Klein | F16K 27/00 |
| 2020/0196488 A1* | 6/2020 | Klein | H05K 7/20181 |
| 2020/0236815 A1* | 7/2020 | Klein | H05K 7/20181 |
| 2020/0236816 A1* | 7/2020 | Klein | H01L 35/28 |
| 2020/0236817 A1* | 7/2020 | Klein | H05K 7/20745 |
| 2020/0236818 A1* | 7/2020 | Klein | H05K 7/20745 |
| 2020/0236819 A1* | 7/2020 | Klein | F16K 3/03 |
| 2020/0245504 A1* | 7/2020 | Klein | H05K 7/20745 |
| 2020/0245505 A1* | 7/2020 | Klein | H05K 7/20745 |
| 2020/0245506 A1* | 7/2020 | Klein | H05K 7/20745 |
| 2020/0245507 A1* | 7/2020 | Klein | H05K 7/20745 |
| 2020/0245508 A1* | 7/2020 | Klein | H05K 7/20745 |
| 2020/0245509 A1* | 7/2020 | Klein | H05K 7/20745 |

* cited by examiner

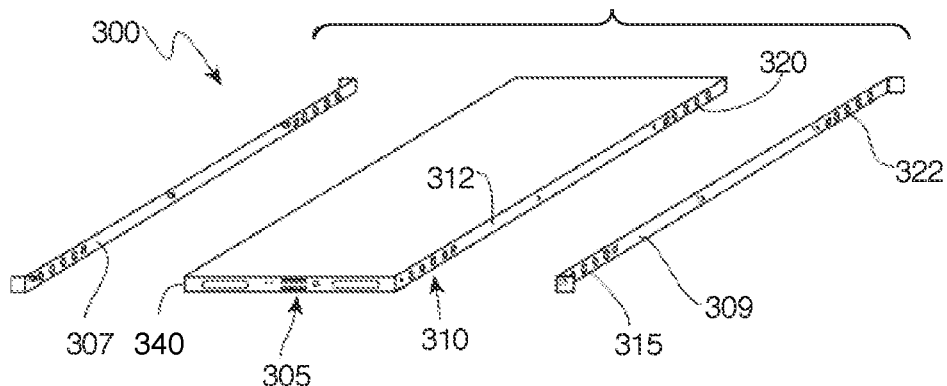
FIG. 3
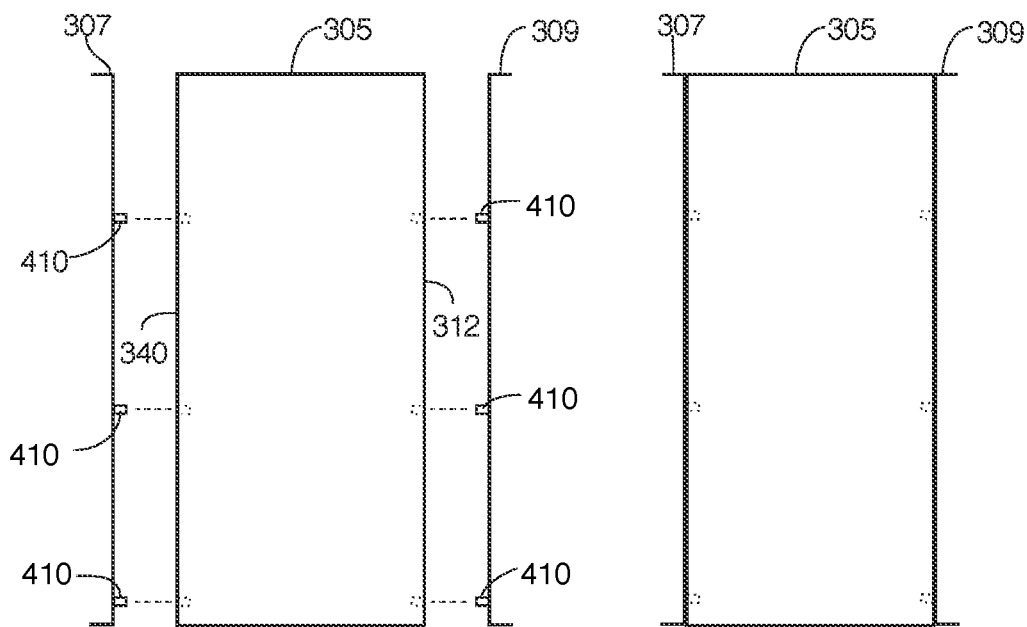
FIG. 4A
FIG. 4B

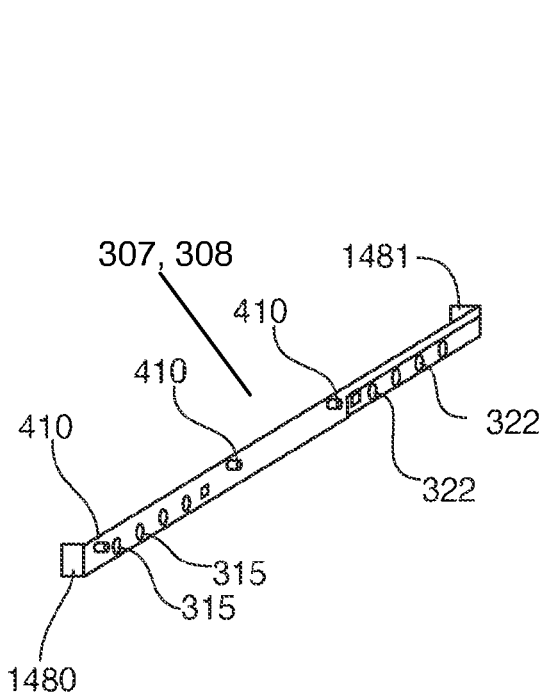
FIG. 14
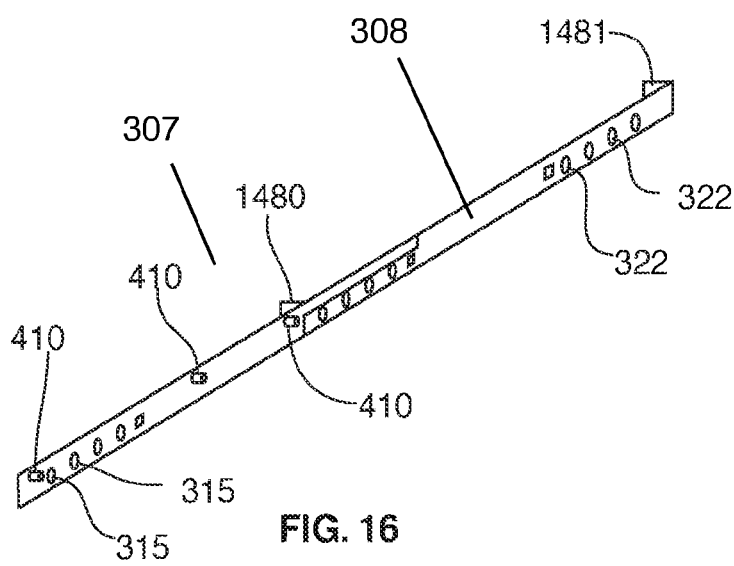
FIG. 16
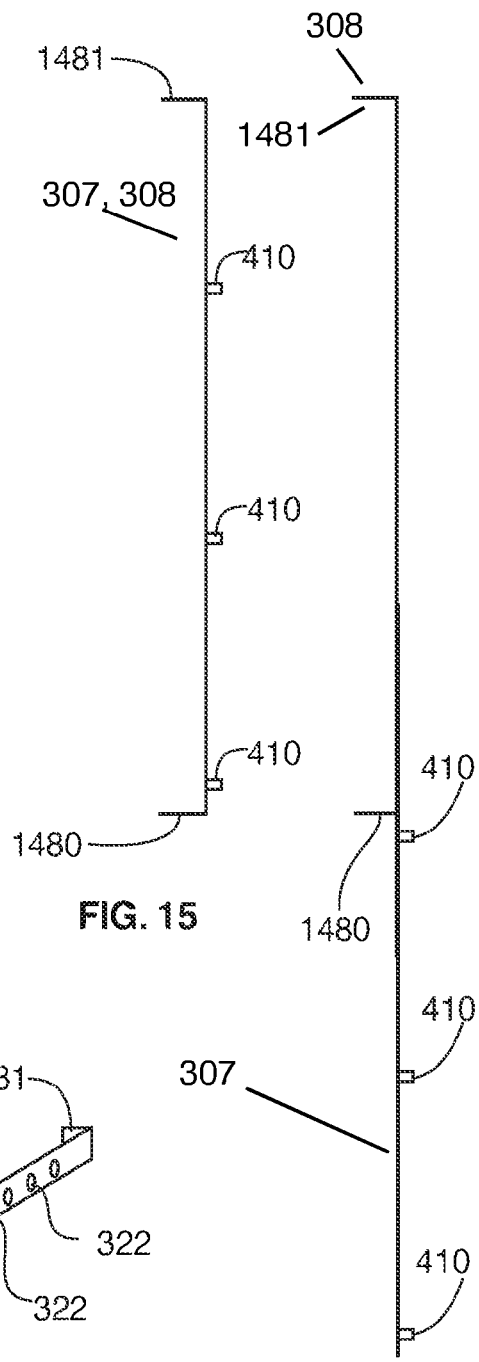
FIG. 15
FIG. 17

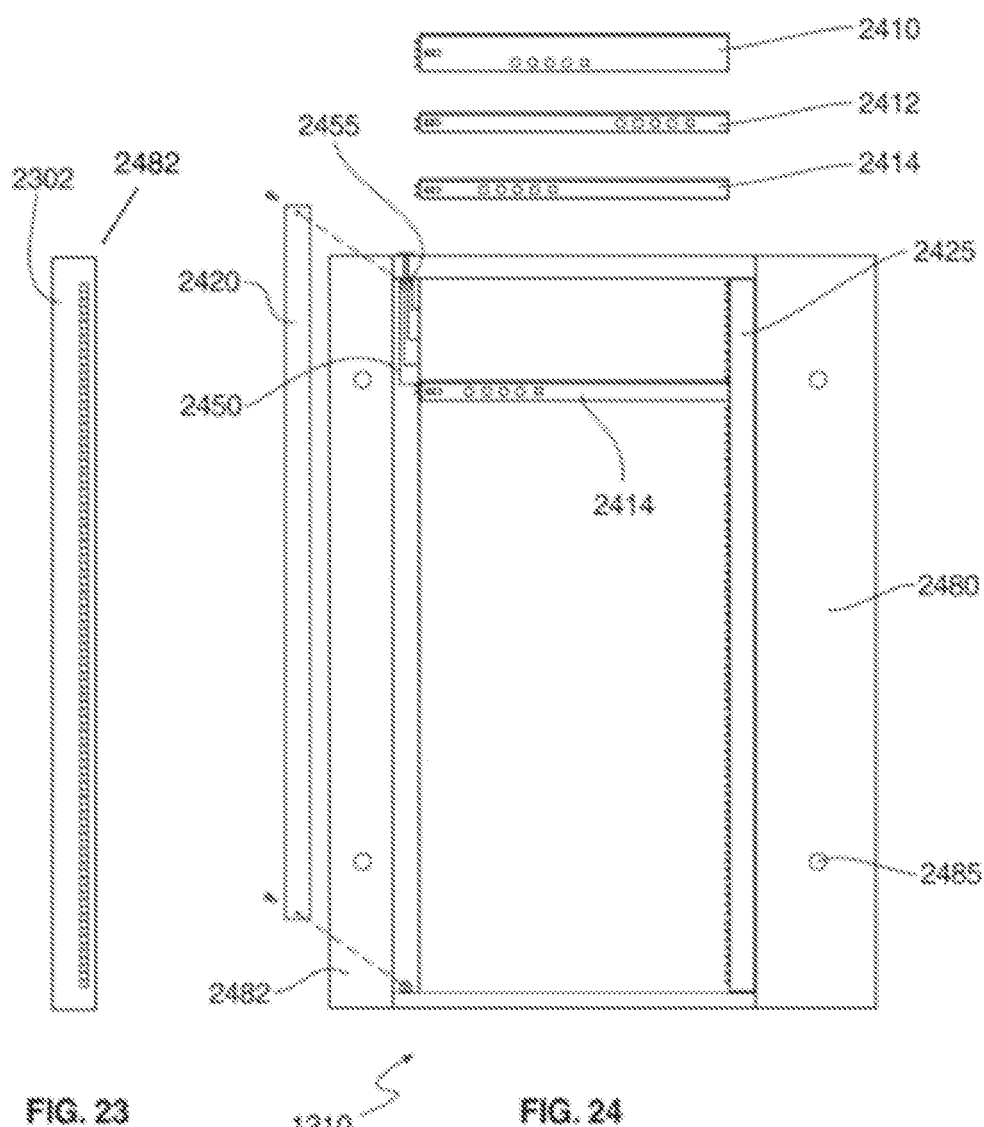

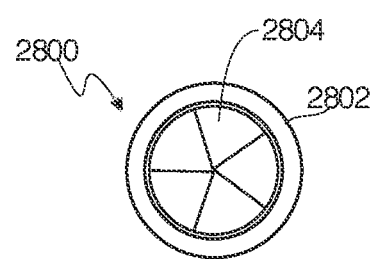
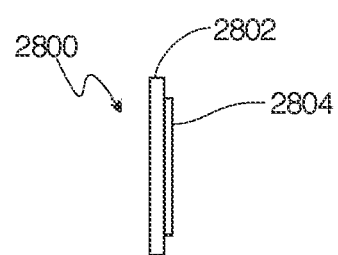
FIG. 28  FIG. 29
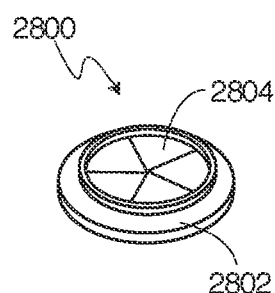
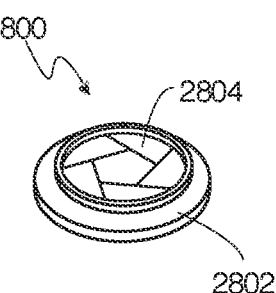
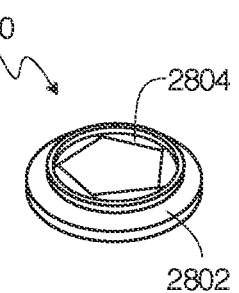
FIG. 30A  FIG. 30B  FIG. 30C

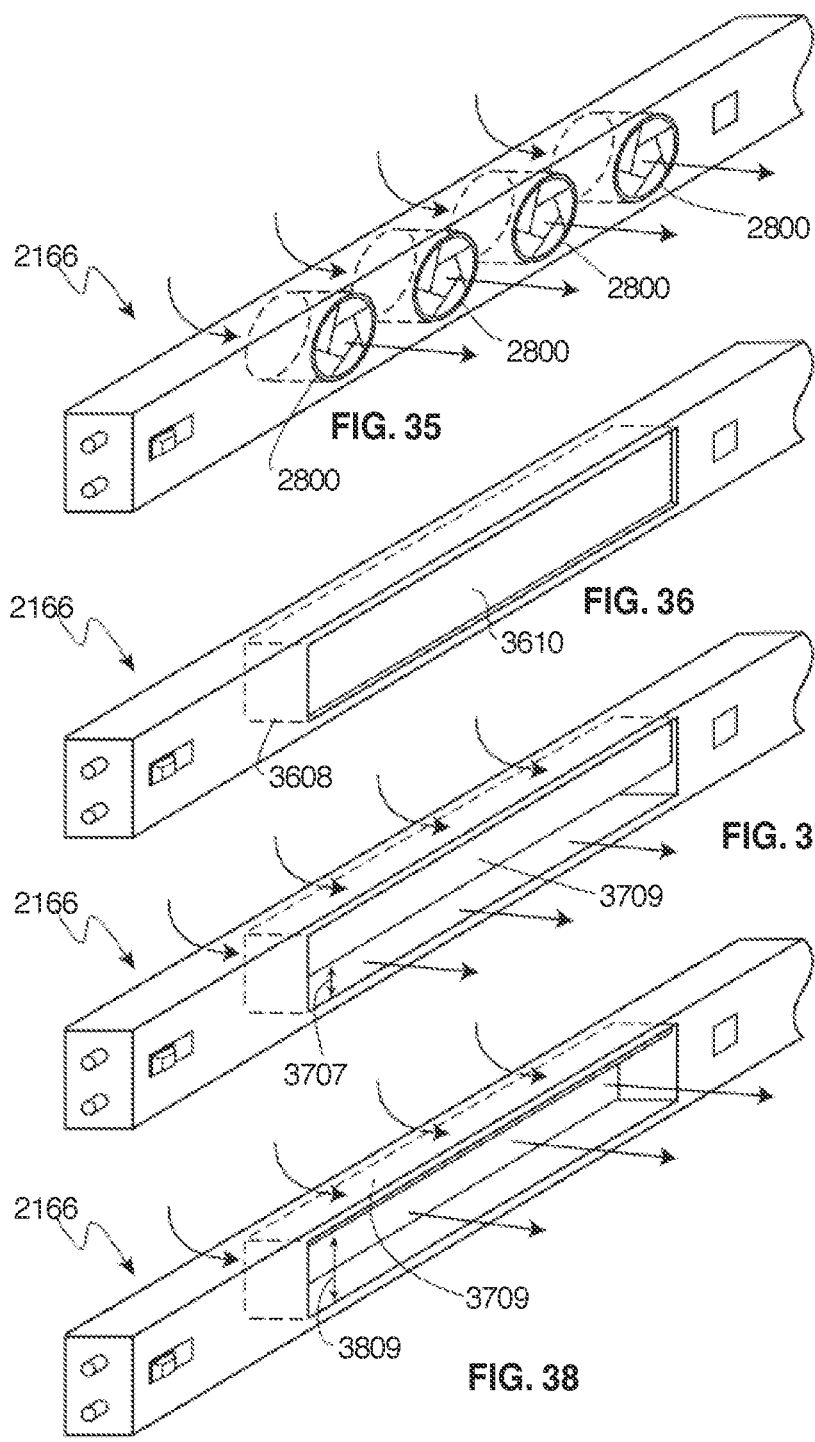

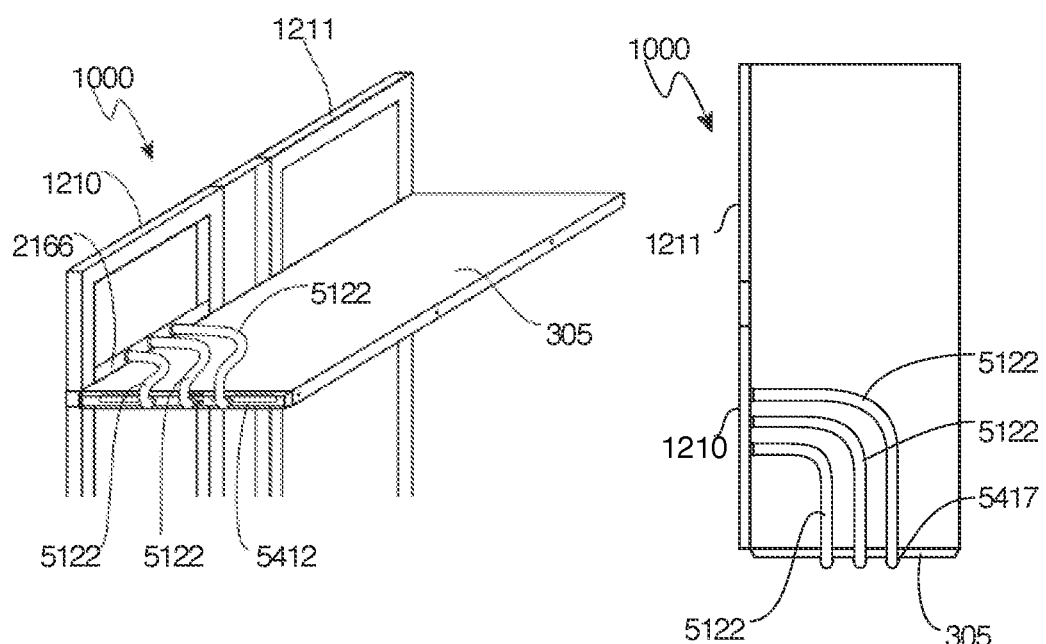
FIG. 54
FIG. 55
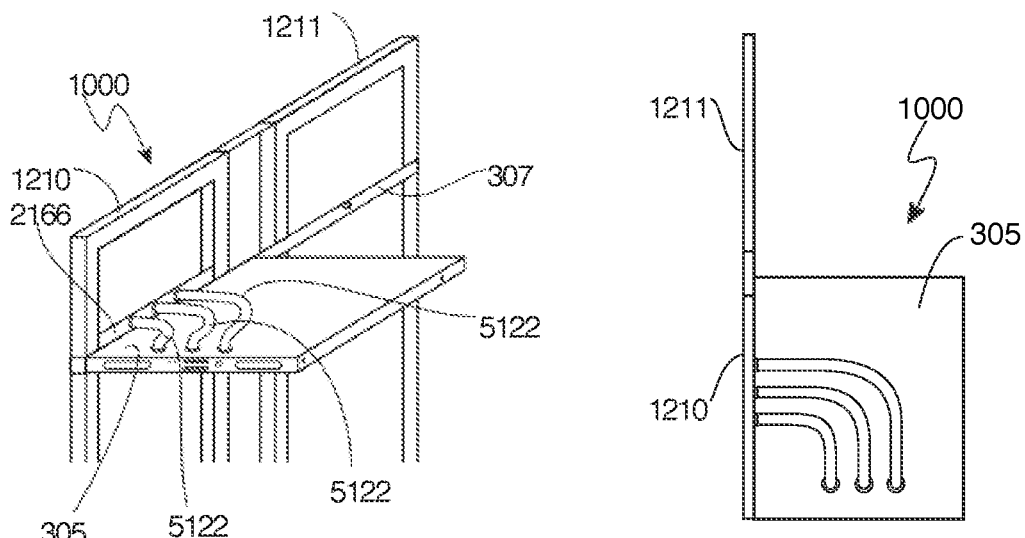
FIG. 56
FIG. 57

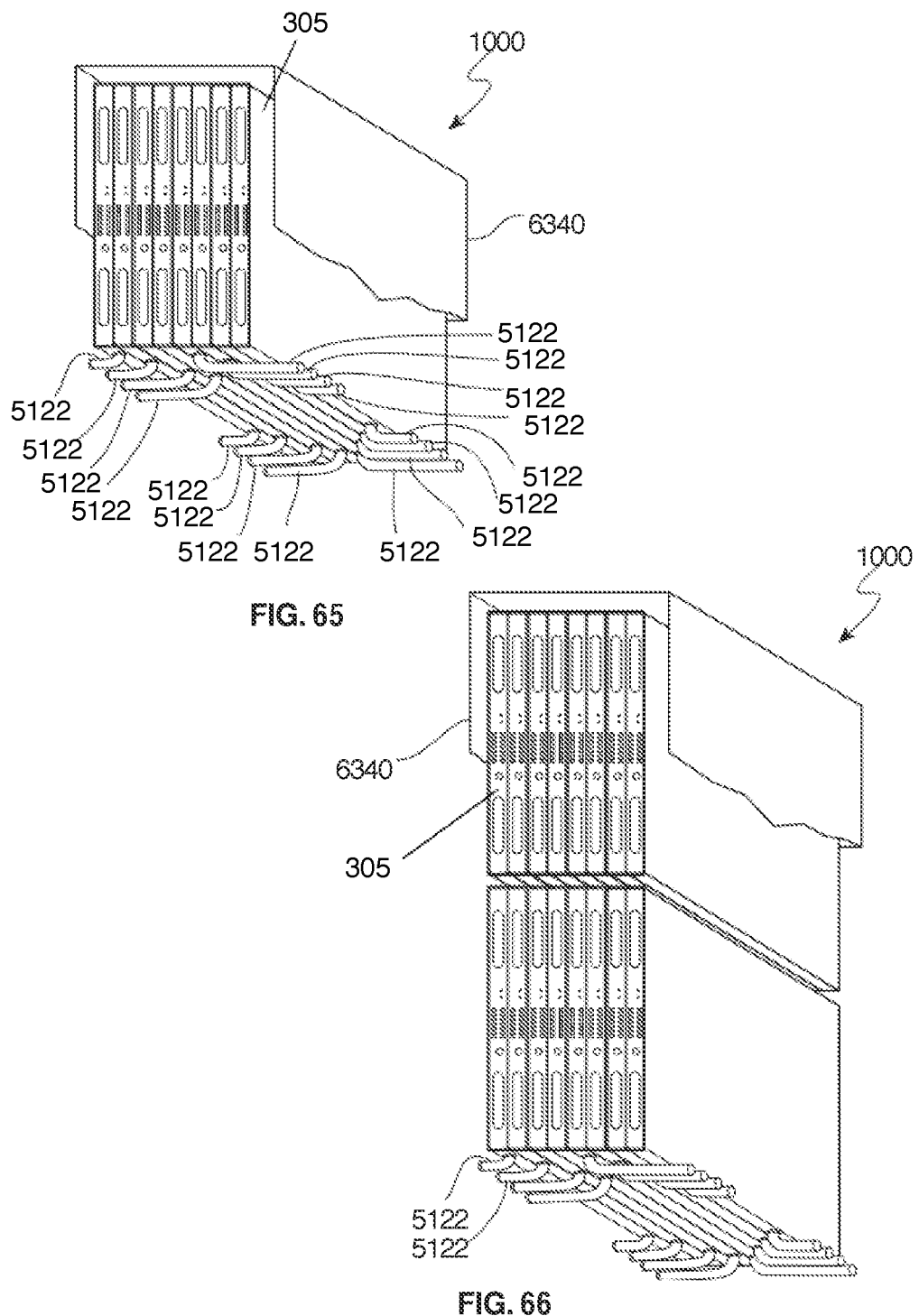

COMPUTER SERVER HEAT REGULATION UTILIZING INTEGRATED PRECISION AIR FLOW

FIELD OF THE INVENTION

The present disclosure relates to a computer server rack and more particularly, a computer server rack system that can be used to efficiently direct air flow to electric equipment such as servers and other network devices for dissipation of heat.

BACKGROUND

Existing rack-mount server systems include a server rack and a plurality of server units received in the server rack. Typically each of the server units is mounted to the server rack with a pair of mounting brackets or rails respectively fixed to the inside surface of opposite sidewalls of a server rack. There have been numerous efforts to direct air and other fluids to electronic equipment to aid in heat dissipation.

SUMMARY

The server rack according to the invention includes a frame that includes hollow tubular support posts on the front sides and rear sides of the device. Between the front and rear posts are forward side panels and rearward side panels. The panels receive a complement of cartridges that have valve members to control the flow of air from a rear cavity though passages in the cartridges, through the rail and into servers. A plurality of side rails for receiving servers are attached to the front and rear posts. The rails have passages through the sidewalls that correspond with passages provided on the sidewalls of the servers.

In a preferred embodiment, air conditioned air is introduced to forward side panels through passages provided on the upper and lower surfaces. Next, air travels from the forward panel, though one or more passages that is provided through a cartridge member, and then, into a front section of a server through a passage that is provided on the lateral sidewall of the server. Air travels through the server from the front section of the server to a rear section and then exits through a passage in the lateral sidewall to a cartridge that is provided in a rear panel. Next the air is returned to the air conditioner unit for recirculation.

In an embodiment the sever rack is approximately 6 feet tall and designed to accommodate forty-two server units in 4.445 cm (1.75 inch) increments. Rail members are provided at each unit segment on the side panels and support a server. In embodiments further discussed below, passages through the cartridges have at least one valve member that can be individually electromechanically or manually controlled. When no server is provided in a specific rack unit, or when the temperature is otherwise adequately controlled in a particular server unit, the aperture may be closed. In embodiments, a controller automatically opens or closes valve members provide in cartridges in response to a signal from a thermometer.

As such, it should be appreciated that the valves or passages can be opened and closed variably for each server depending on the cooling needs for the server. Further, as discussed herein, the degree of air flow through the aperture can be controlled using a damper or weir arrangement. Therefore, in embodiments, a local controller is provided and can receive input information from thermometers reading the temperatures of the servers and can adjust the opening and closing valve apertures accordingly. Alternatively the dampers may be manually adjusted. In yet further embodiments a central controller receives signals from a plurality of server racks.

Each of the openings on the post is provided with a releasable seal to block flow depending on the particular configuration of servers. In embodiments, flexible manifolds extend from the posts to direct the fluid to and from access areas provided on the servers. While the preferred embodiment contemplates the use of air flow, in embodiments the frame is configured to receive a liquid and the posts and manifold direct fluid to heat exchange elements that engaged the respective servers.

In yet further embodiments the rack is configured to allow both liquid flow and air flow.

These aspects of the invention are not meant to be exclusive. Furthermore, some features may apply to certain versions of the invention, but not others. Other features, aspects, and advantages of the present invention will be readily apparent to those of ordinary skill in the art when read in conjunction with the following description, and accompanying drawings.

BRIEF DESCRIPTION OF THE DRAWINGS

FIG. 3 is a perspective exploded view of a first rail assembly, a server and a second rail assembly according to an embodiment of the invention.

FIG. 4A is a top exploded view of a first rail assembly, a server and a second rail assembly according to an embodiment of the invention.

FIG. 4B is a top view of a first rail assembly, a server and a second rail assembly attached together according to an embodiment of the invention.

FIG. 14 is a perspective view of a rail assembly that is used connection with an embodiment of the invention.

FIG. 15 is a top view of the rail assembly that is shown in FIG. 14.

FIG. 16 is a perspective view in elevation of the rail assembly with the front section extended from the rear section that is shown in FIG. 14.

FIG. 17 is a top view of the rail assembly with the front section extended from the rear section.

FIG. 23 is a front view in elevation of a post member used in connection with the invention.

FIG. 24 is a fragmented view in elevation of a forward side panel, a series of cartridges, a cover plate and a forward post according to an embodiment of the invention.

FIG. 28 is a top view of an iris air flow control valve used in a cartridge according to an embodiment of the invention.

FIG. 29 is a side view of an iris valve used in a cartridge according to an embodiment of the invention.

FIG. 30A is a perspective view of an iris valve used in a cartridge according to an embodiment of the invention in a closed position.

FIG. 30B is a perspective view of an iris valve used in a cartridge according to an embodiment of the invention in a partial opened position.

FIG. 30C is a perspective view of an iris valve used in a cartridge according to an embodiment of the invention in a fully opened position.

FIG. 35 is a perspective partial view of a cartridge according to an embodiment of the invention.

FIG. 36 is a perspective partial view of a cartridge according to an embodiment of the invention depicting a central channel impeded by a block member.

FIG. 37 is a perspective partial view of a cartridge according to a further embodiment of the invention with a central channel that is partially impeded by an adjustable shutter and that schematically depicts air flow through the device.

FIG. 38 is a perspective partial view of a cartridge according to the embodiment depicted in FIG. 36 that schematically depicts air flow through the device.

FIG. 43A is a side sectional view of the cartridge embodiment depicted in FIG. 43 without the top seal member.

FIG. 54 is a perspective fractional front view of an embodiment of the invention wherein air is delivered from the side panel cartridge to the front of a server using a flexible hose.

FIG. 55 is a top view of the embodiment depicted in FIG. 54.

FIG. 56 is a perspective fractional front view of an embodiment of the invention wherein air is delivered from the side panel cartridge to an opening in the top of a server using a flexible hose.

FIG. 57 is a top view of the embodiment depicted in FIG. 54.

FIG. 65 is a front fractional view of a chassis containing a number of blade servers according to an embodiment of the invention.

FIG. 66 is a front perspective fractional view of a chassis containing a number of blade servers in multiple rows according to an embodiment of the invention.

DETAILED DESCRIPTION

Figure 1:
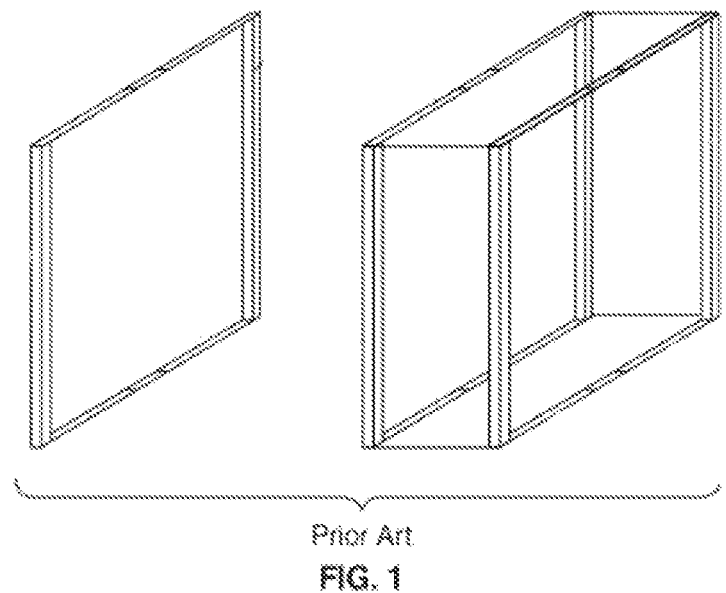
FIG. 1 is a perspective view of a prior art server rack and side panel.

The forgoing description, including the accompanying drawings, is illustrated by way of example and is not to be construed as limitations with respect to the invention. Now referring to FIG. 1, a prior art rack system is depicted that includes upright members and side members and is configured to receive a plurality of servers.

Figures 2A, 2B:
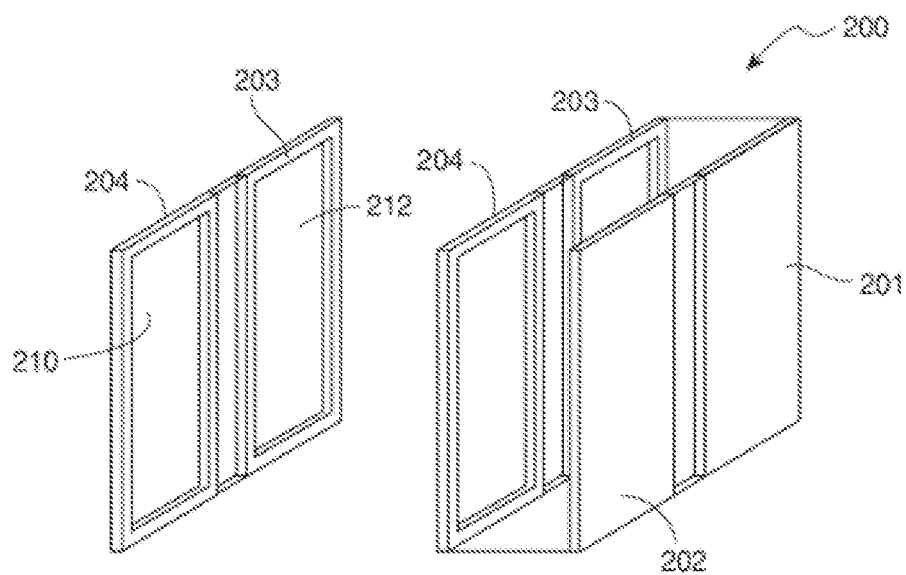
FIG. 2A is a perspective view of a partial rack assembly according to an embodiment of the invention.
FIG. 2B is a perspective view of two side panels of a partial rack assembly according to an embodiment of the invention.

FIGS. 2A and 2B depicts aspects of an embodiment of the invention 200 including forward side panel 204 and 202 and rearward side panels 201 and 203. As best seen in FIG. 2B the side panels have respective cavities 210, 212 on their inner sides. The opposite side panels may be attached together by a rear member or rear panel or other transverse members that spans the opposite sidewalls of the device.

Now referring to FIG. 3, a further feature of embodiments of the invention 300 includes use of a rail member 307 which is configured to be attached to server 305. On the opposite side of the server is rail 309 which includes passages 315 and 322 which correspond with adjacent passages such as front passages 310 and rear passages 320 that are located on each lateral sidewall 312, 340 of the server 305.

FIGS. 4a and 4b illustrates how rails 307, 309 engage server 305 using fasteners 410 on one side and on the opposite side. FIG. 4b depicts the rails attached to the server 305.

Figure 5:
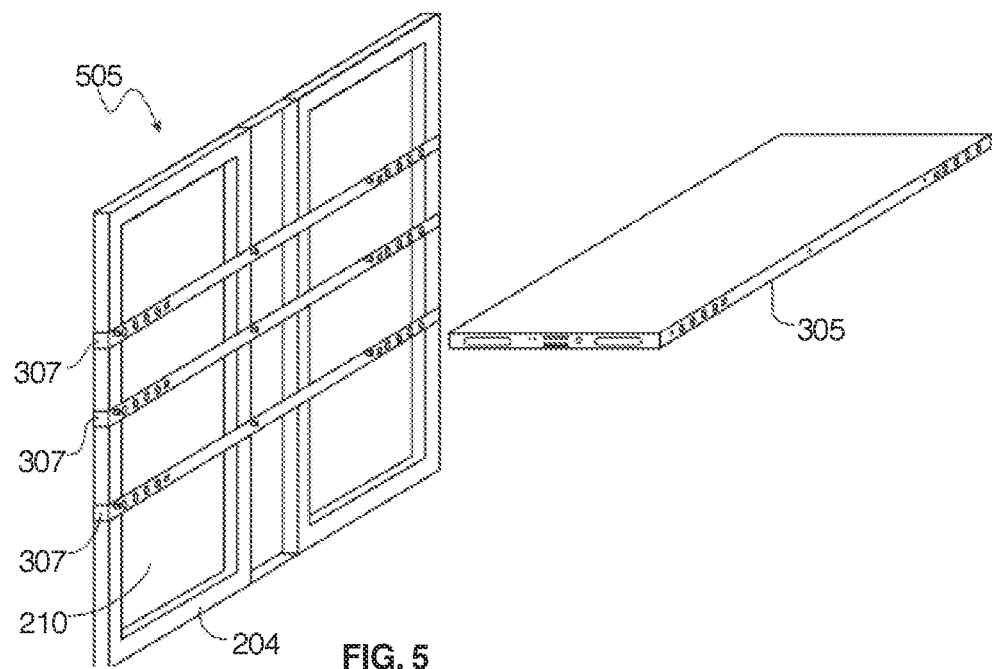
FIG. 5 is a perspective exploded view of a side panel and server in alignment before assembly according to an embodiment of the invention.

FIG. 5 shows a plurality of rails 307 that are secured to lateral panels 505. These rails are configured to engage server 305.

Figure 6:
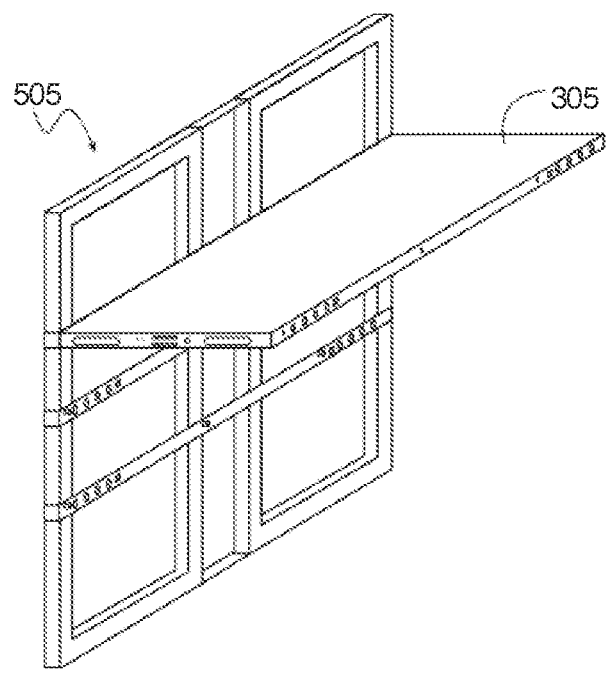
FIG. 6 is a perspective view of a side panel and server attached to one another.

FIG. 6 depicts the side panel 505 wherein server 305 is engaged with the panel at the top rail.

Figure 7:
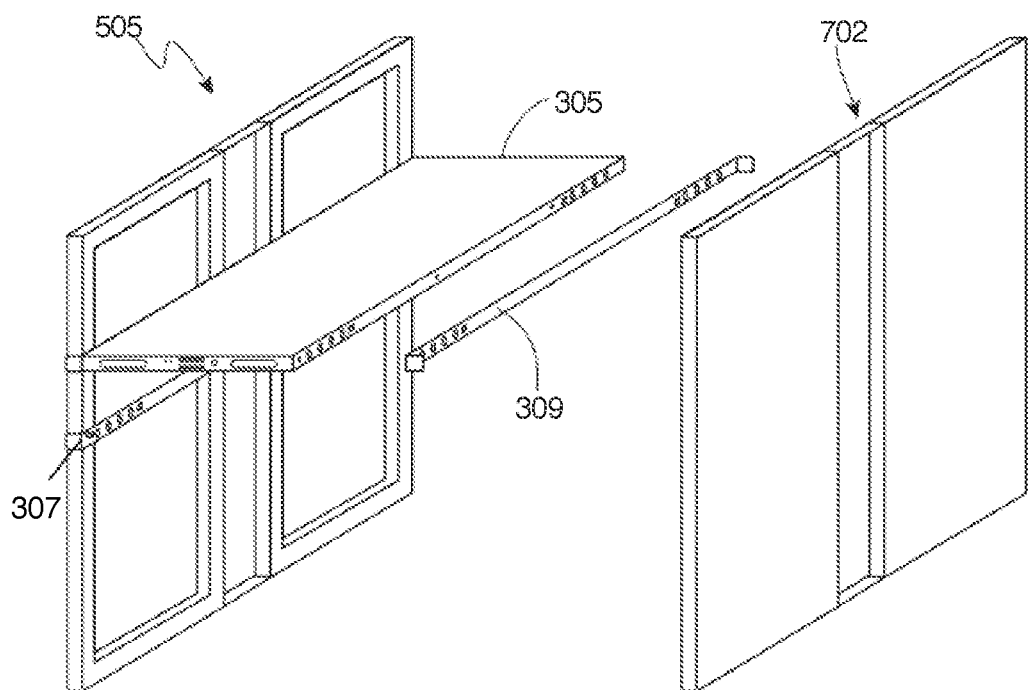
FIG. 7 is a perspective exploded view of side panel rails, a server and a second panel according to an embodiment of the invention.

FIG. 7 depicts an exploded view of the assembly of rack assembly components including side panel 505, rails 307, 309 and opposite side panel 702.

Figure 8:
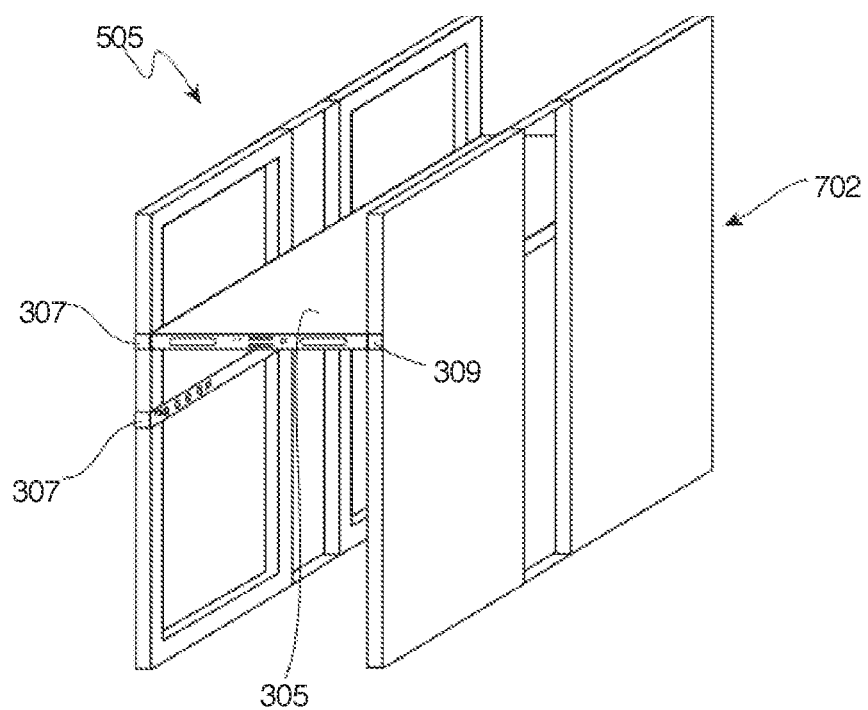
FIG. 8 is a perspective view of side panel rails, a server and a second panel according to embodiment of FIG. 7 that has been assembled.

FIG. 8 is an embodiment of the invention holding server 305 between panels 505 and 702. Server 305 slides along rails 307,309 which are affixed to the side panel sections 505, 702.

Figure 9:
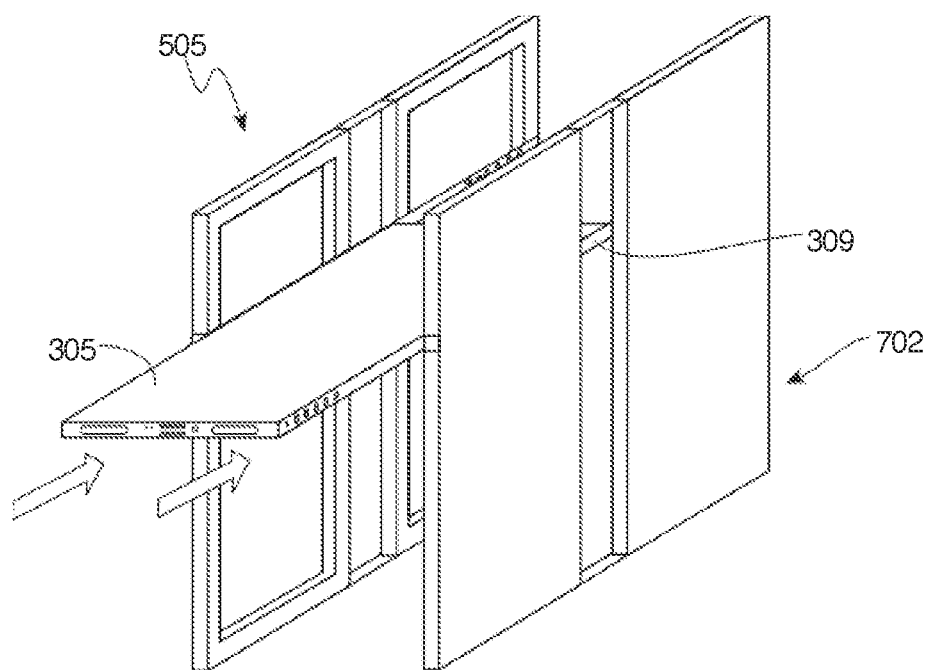
FIG. 9 is a perspective view of a rack assembly including side panels, rails, and a server that schematically illustrates a server sliding into the assembly.

FIG. 9 depicts how the server 305 slides in to the rack system from the front along the opposite rails 307 and 309 attached to panels 505 and 702 in an embodiment of the invention.

Figure 10:
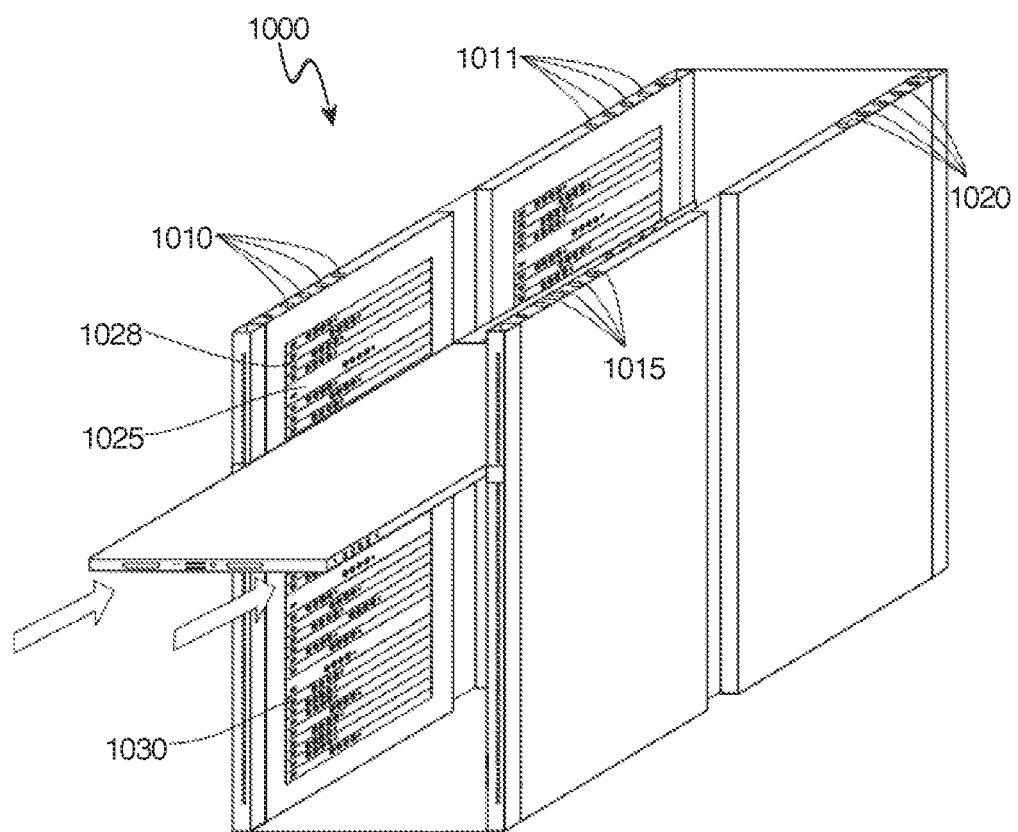
FIG. 10 is a perspective view of a side panel, rails, a server and a second panel that further includes cartridges received in the forward and rearward side panels that illustrate a server sliding into the assembly.

FIG. 10 depicts assembly of the present invention 1000 that includes a depiction of the air passages 1010, 1011, 1015, and 1020 in the lateral side panels. In this embodiment there are a plurality of cartridges provided in the side panels such as cartridges 1025, 1028, 1030. A server is received in the rack member by sliding it in the direction illustrated along the opposite rails.

Figure 11:
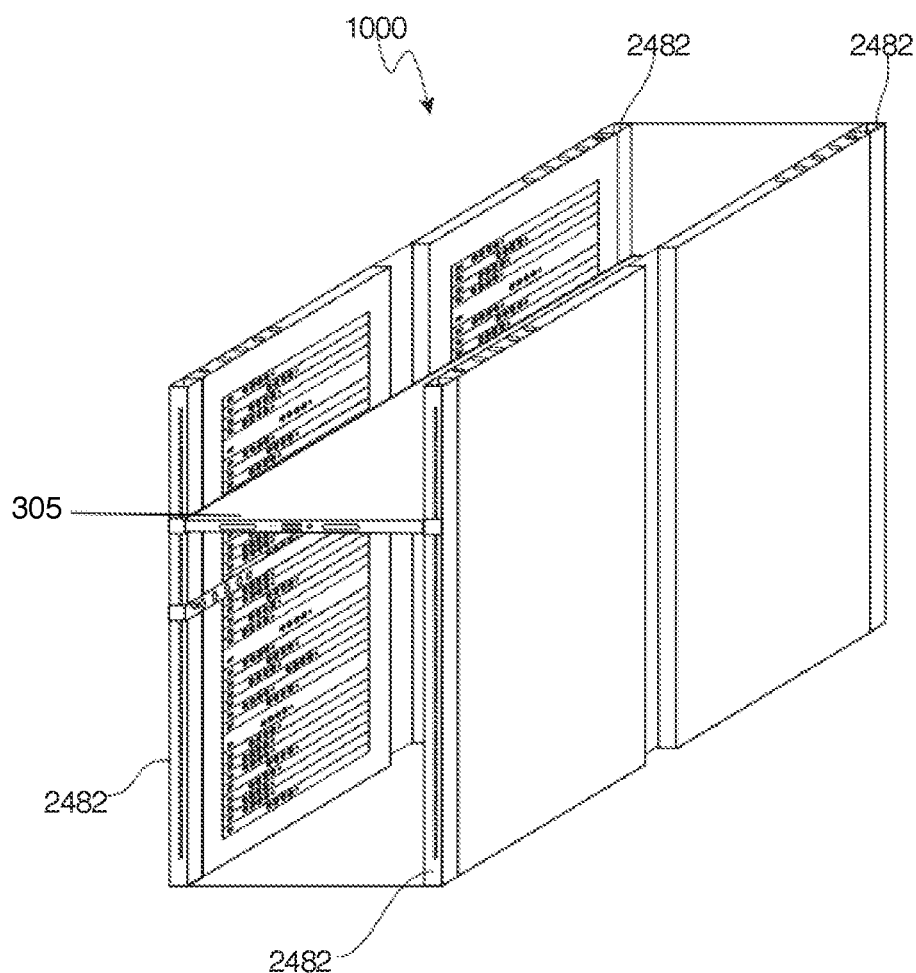
FIG. 11 is a perspective view of the embodiment depicted in FIG. 10 with a server secured within the device.

FIG. 11 depicts the rack assembly invention 1000 including server 305 in engagement with the rails in position along with the upright members 2482. The panel depicts a series of cartridges attached and connected to the panel wherein the cartridges are designed to control the flow of air from the panel to the servers.

Figure 12:
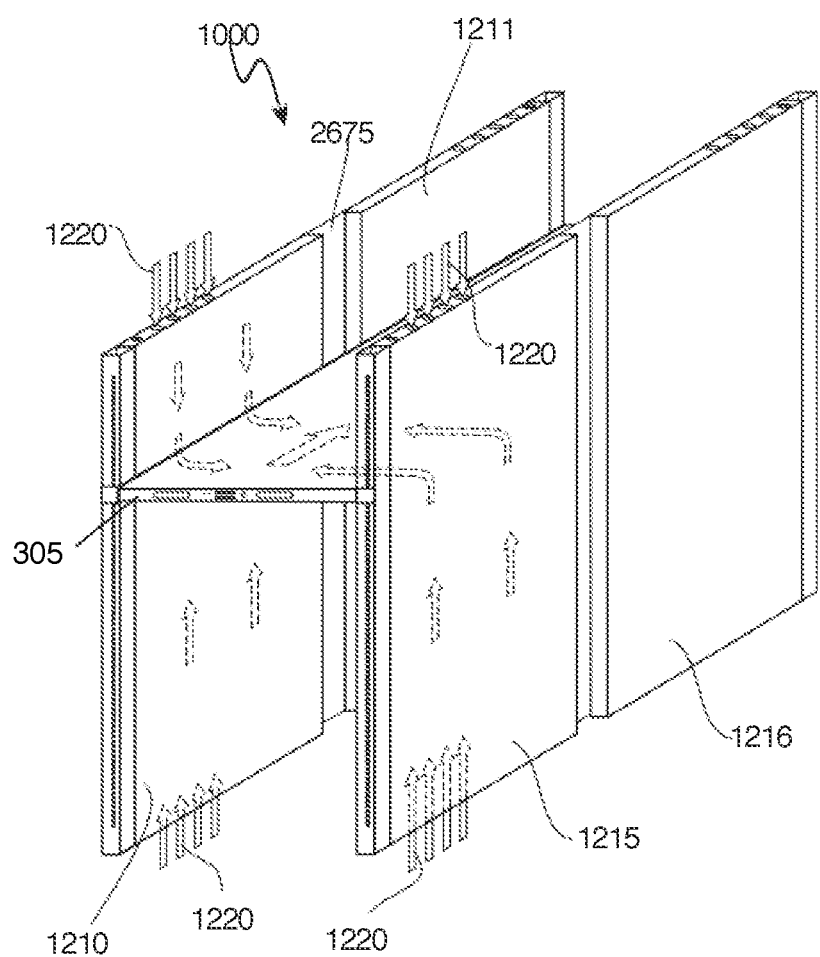
FIG. 12 is a perspective illustration of an embodiment of the invention that includes a schematic representation of the direction of air flow from the forward panels to a server.
Figure 13:
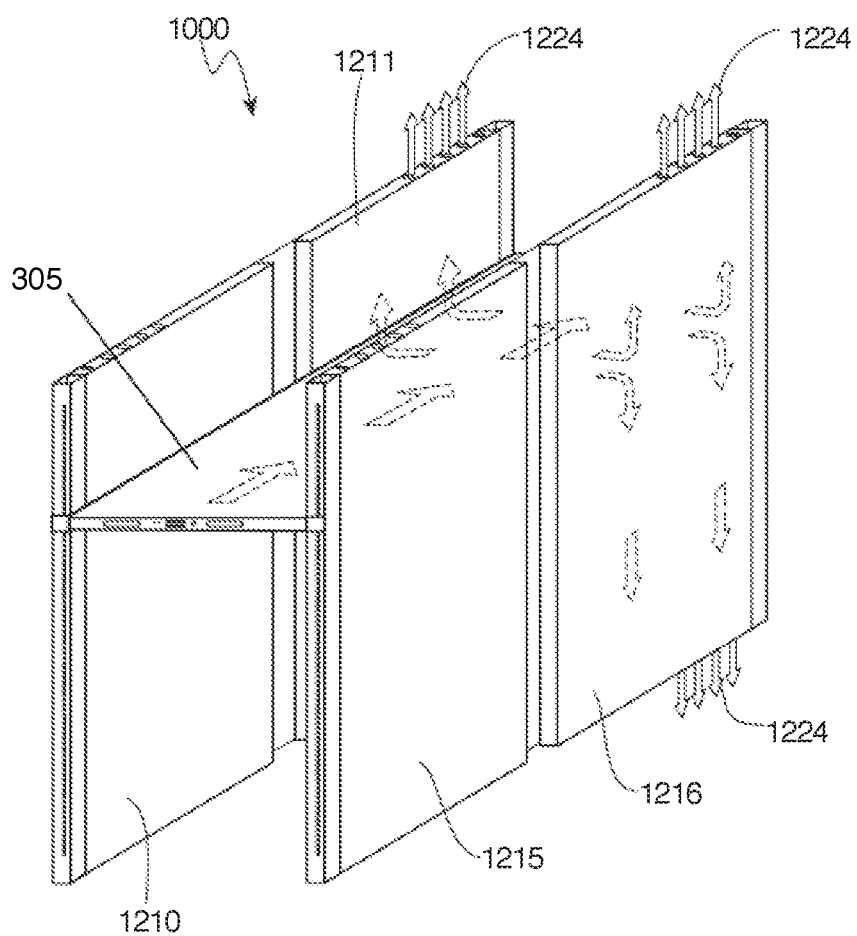
FIG. 13 is a perspective illustration of an embodiment of the invention that includes a schematic representation of the direction of air flow from a server through rearward side panels.

FIGS. 12-13 illustrate the airflow though the rack of the invention. Incoming airflow 1220 enters the left and right side panel sections 1210, 1215 through passages that are provided on the top and bottom surface and passes from the front of the panel, through cartridges, through rails and into a server. Air from the servers 305 passes rearward and out passages into the sidewalls of the rails back to rear panel sections 1211, 1216. Outgoing air 1224 passes from the through passages provided on the top and bottom of the panels.

Now referring to FIGS. 14-17, a two part rail member 307,308 is depicted that includes passages 315 to allow for air flow and are located at the front of rail member 307,308 and passages 322 near the opposite end when the two part rail member 307, 308 is in a retracted position. The two parts of the rail slide along one another to allow the rail to extend, such as that used in a conventional drawer. In embodiments the rails may include bearing and roller elements. Each end of rail 308 has attachment sections 1480 and 1481 that are oriented perpendicular to the length of the rail element and includes fastening means to engage the upright members. The rail includes fastener elements 410 that engage the server. FIG. 15, a top view of the rail 307,308, depicts the fastening members 410. As seen in FIG. 16, the passages 315, 322 allow air flow though the rail. FIG. 17 depicts a rail with the forward member fully extended.

Figure 18:
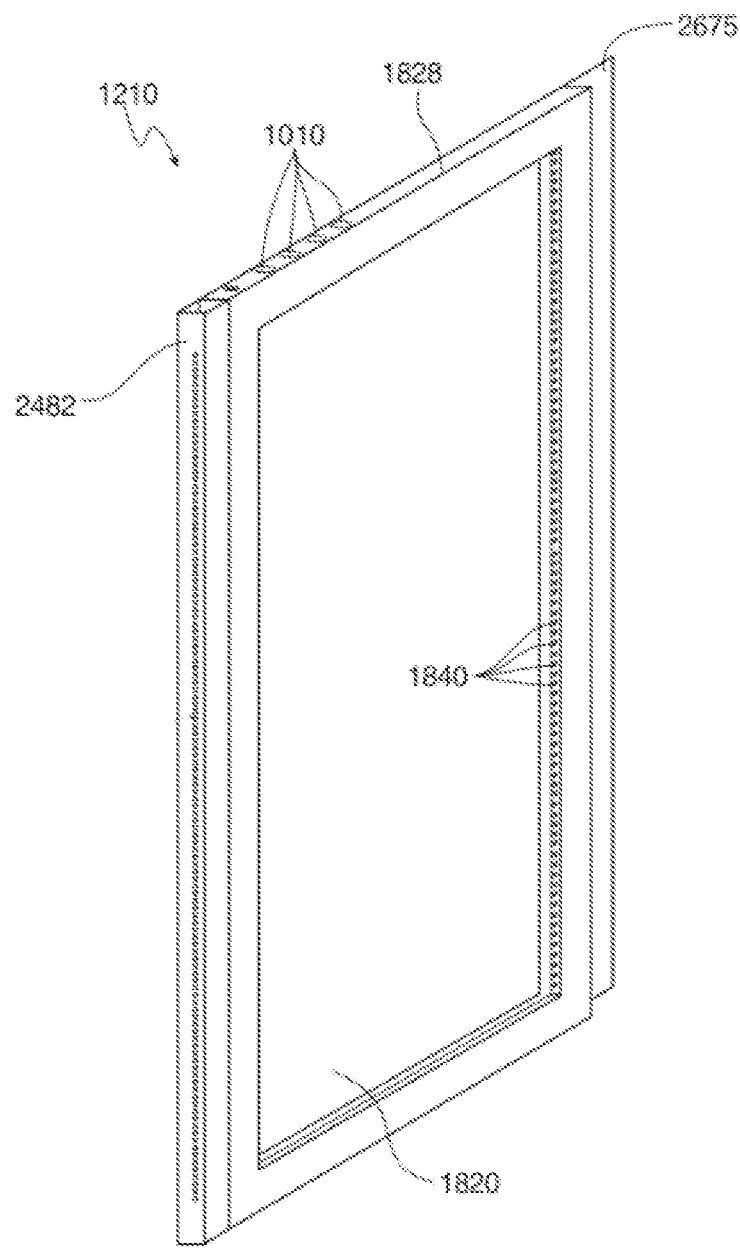
FIG. 18 is a perspective view of a forward side panel and forward post according to an embodiment of the invention depicting the top surface of the panel.

FIG. 18 depicts panel section 1210 that includes a front hollow upright member 2482 and rear upright member 2675 that frame side panel section 1210. Top surface 1828 of panel section 1210 includes passages 1010 that allows airflow into the panel member. Along the inside surface of panel are a series of electrical contact pins 1840 that are designed to receive the cartridge members in the recessed region 1820.

Figure 19:
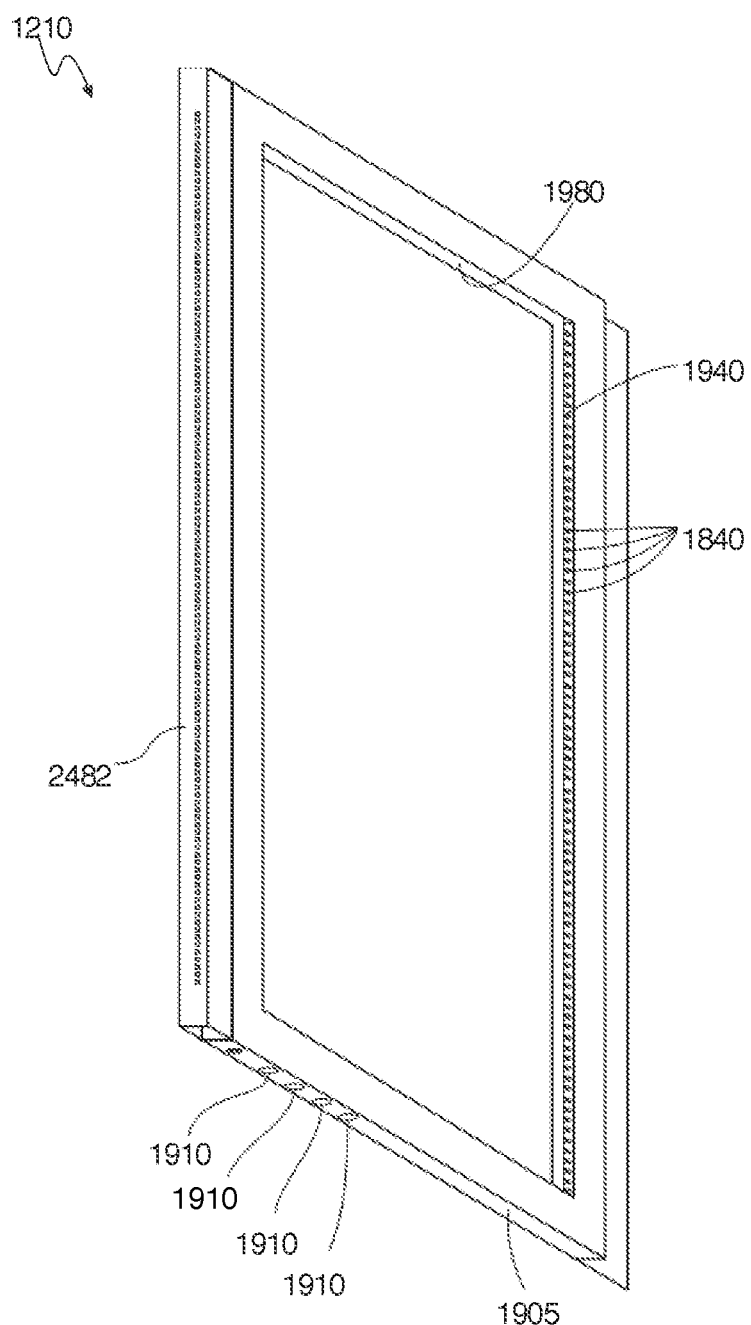
FIG. 19 is a perspective view of a forward side panel and forward post shown in FIG. 18 depicting the bottom surface of the panel.

FIG. 19 depicts panel 1210 illustrating the bottom surface 1905 that includes a services of passages such as passages 1910 that allow air flow into the panel. In embodiments, interior horizontal surface 1980 of the panel is provided with an elastomeric material on the surface which can engage opposite surfaces of the cartridge and establish an air tight seal. Vertical surface 1940 has a series of contact pins 1840 that can establish an electrical connection with the cartridge members. Like surface 1980, in embodiments, the surface 1940 panel is provided with an elastomeric material on the surface which can engage opposite surfaces of the cartridge and establish an air tight seal.

Figure 20:
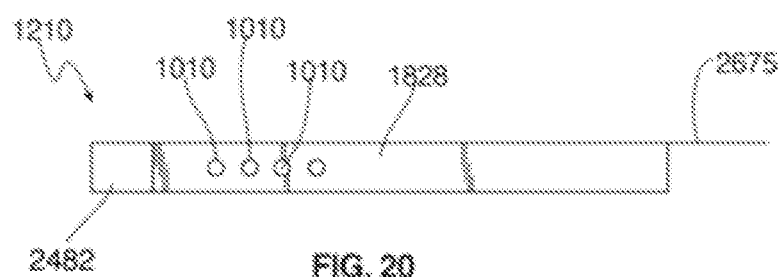
FIG. 20 is a top view of the forward side panel and forward post shown in FIG. 18.

FIG. 20 is a top view of panel section 1210 showing openings 1010 through top surface 1828. The openings provide an entrance for air flow to a section of the panel member.

Figure 21:
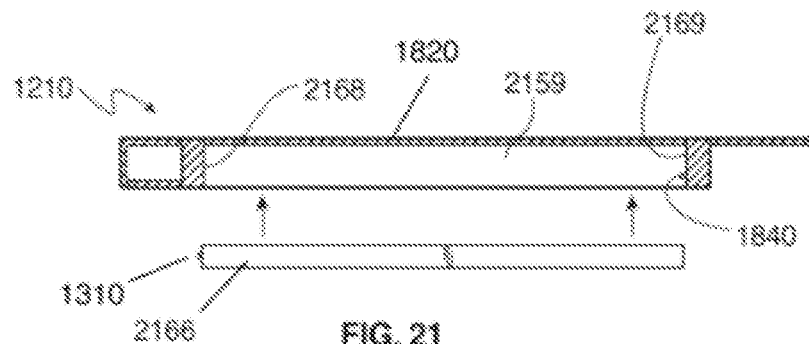
FIG. 21 is a top sectional view of the forward side panel and forward post shown in FIG. 18 also depicting a cartridge and the manner in which it is received in the panel.
Figure 22:
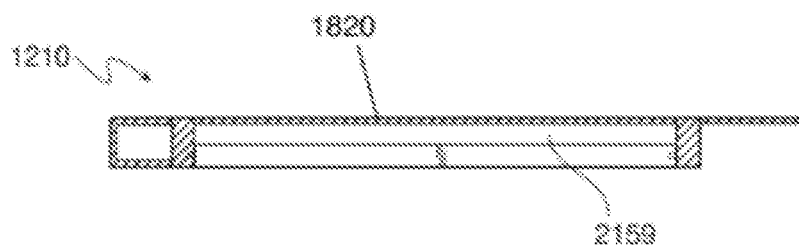
FIG. 22 is a top sectional view of the forward side panel and forward post shown in FIG. 18 with a cartridge retained in the panel.

FIGS. 21 and 22 are top sectional view of panel 1210 that shows how cartridge is received in the panel. In this regard, the cartridge 2166 is retained in place by pins 1310 and 1840 which engage upright members 2168, 2169 located in the lateral panel where there is an upright member cavity. The assembly creates a void 2159 behind the cartridge. FIG. 22 depicts a top section view of the engagement of the cartridge with a side panel member 1210.

FIGS. 23 and 24 includes a side view of a series of different cartridges 2410, 2412, 2414, that have passages through their respective lateral sides that are at different locations. The cartridges are designed to complement different servers that may be used in the rack system. Cartridge 2414 is depicted in engagement with side panel member 1210. It is in electrical connection to a central bus 2455 by control wire 2450 that is routed through a cavity in the side portion of panel 1210. The cavity within the side panel is covered by plate 2420 or plate 2425. FIG. 23 is a front view of member 2482 and surface 2302 depicts holes provided for attachment of the rails members. Flange section 2480 and aperture 2485 is provided for attachment to the supporting frame for the rack system.

Figure 25:
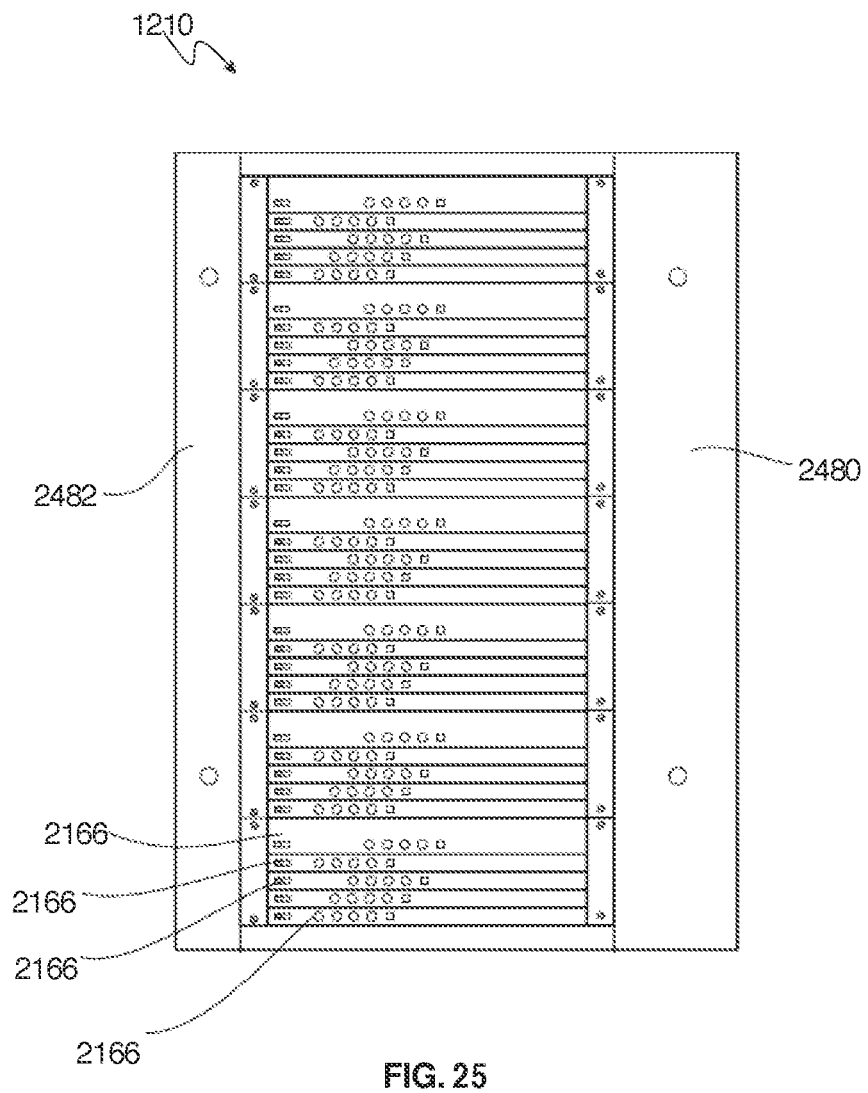
FIG. 25 is a front view in elevation of a forward panel having a complete complement of cartridges.

FIG. 25 depicts a side view of an exemplary panel 1210 containing a plurality of cartridges, such as cartridges 2166. In addition, FIG. 25 depicts an alternative configuration of cover plates.

Figure 26:
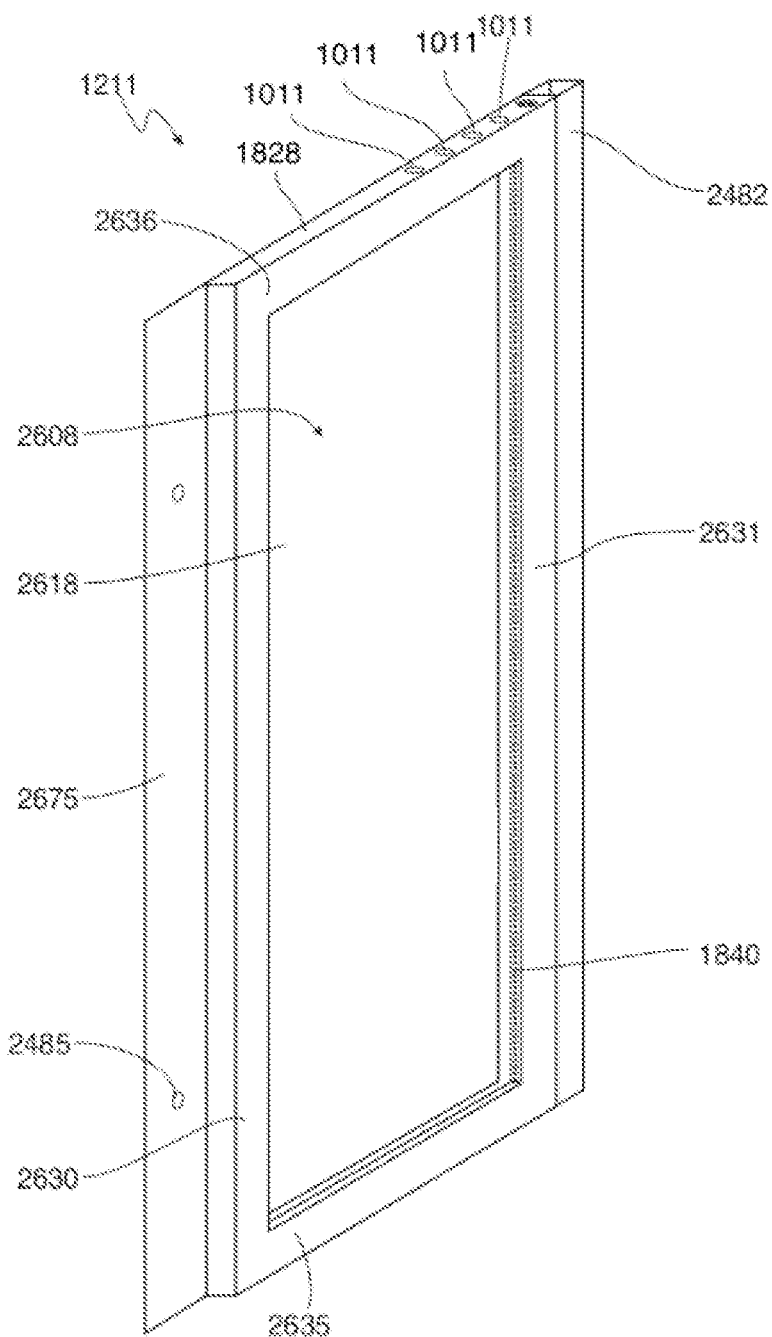
FIG. 26 is a perspective view of a rearward side panel depicting the top surface.
Figure 27:
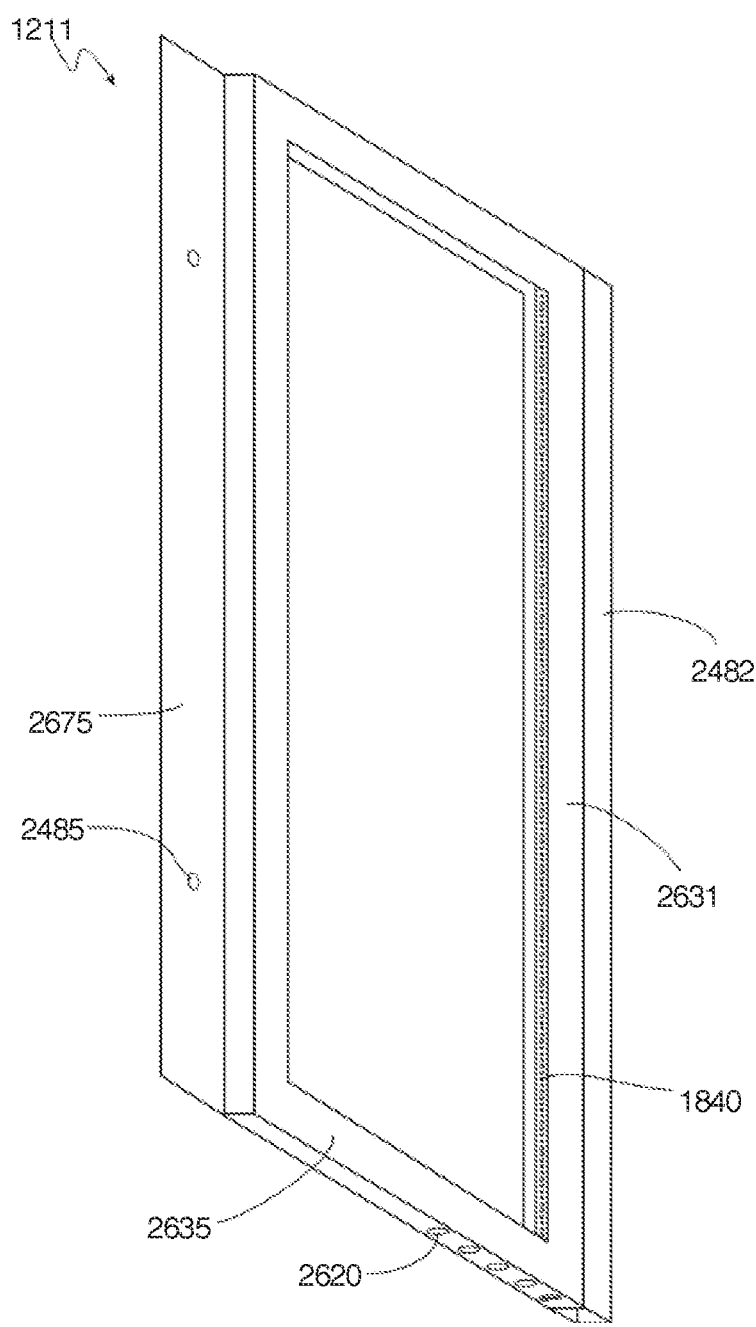
FIG. 27 is a perspective view of a rearward side panel depicting the lower surface.

FIG. 26 depicts a rearward side panel 1211 designed to be used in the rack system of the invention. Like the front panel, rearward panel 1211 includes a series of vertical passages 1011 though top surface 1828 of panel 1211. The passages terminate in the recess region 2608 defined by upright members 2482 and horizontal members 2635 and 2636 and rear flat section 2618. The panel 1211 is attached to the supporting frame for the rack using flange member 2675. At the rear of the section, upright post members 2630, 2631 provides additional structural support for the panel. As shown in FIG. 27, panel 1211 also includes passages through the lower member 2635 such as passage 2620. A series of connector pins 1840 is provided on upright member 2631 for engagement to the cartridges.

Now referring to FIGS. 28-30C an exemplary iris control valve 2800 is shown. The valve includes movable panel 2804 that can be opened and closed to define different sized openings that are retained by an annular ring 2802.

Figure 31:
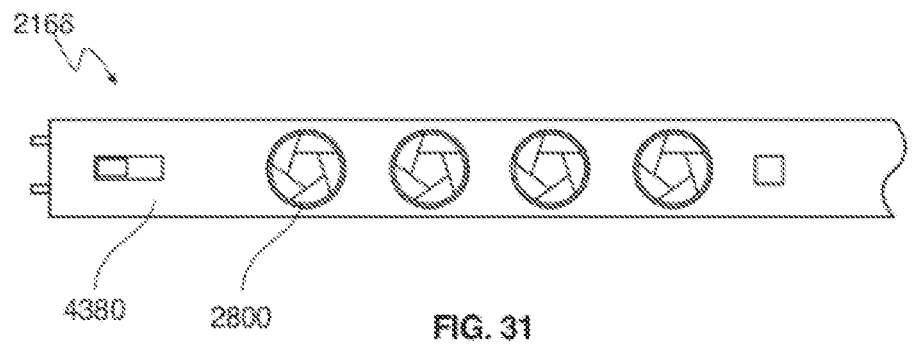
FIG. 31 is a side fractional view in elevation of a cartridge assembly with the valves partially opened.
Figure 32:
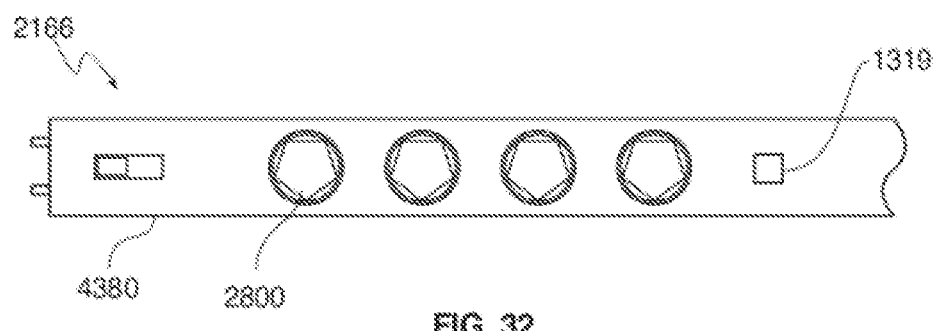
FIG. 32 is a side fractional view in elevation of a cartridge assembly with the valves fully opened.
Figure 33:
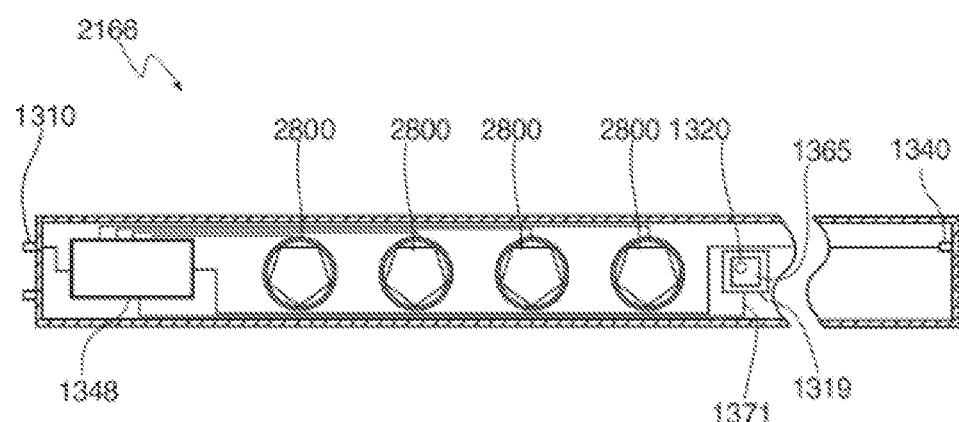
FIG. 33 is a side sectional fractional view in elevation of a cartridge assembly.

FIGS. 31 and 32 depict cartridge assembly 2166 that includes a control switch 4380 which can be used to slide the pin members into or out of the panel to lock the cartridges into place. In embodiments, a control valve is manually manipulated to selectively open and close the valves 2800. In further contemplated embodiments, valves may be opened and closed using a sliding planar sheet that covers the passage. In yet further embodiment the cartridge may use a motorized screw gear that may be controlled by a rotating handle at the top of the panel attached to an extended threaded rod and the rotational movement of the rod is translated to rectilinear motion. In yet a further embodiment the cartridge may use a servo-motor that may be connected to the iris valve selector arm by a connecting rod. In embodiments, on the ends of the cartridge are spring biased contact pins such as pin 1310 that is designed to engage the lateral interior side surfaces of forward or rearward panel members. As seen in FIG. 33, sensor 1319 is designed to detect the presence of an adjacent server. In an embodiment, the sensor includes is an infrared light 1320 and photo detector 1365 wherein light is reflected from a reflective surface provided on the server can be detected. When the server is present opposite the detector infrared light is reflected off of a surface on the server and impinges on the photo detector. The photo detector then sends a signal via wire 1371 to controller 1348 which in turn can provide a signal to open the valves, such as valve 2800, on the cartridge opposite the sever and allow air to flow.

In yet further contemplated embodiments the sensor can communicate with the server transmitted by the server, such as a signal containing information relating to the internal temperature of the server components. This signal is transmitted to the controller and may be further related to the processor associated with a server rack. The server rack processor received data from the various servers and the status of the valves that are associated with the cartridges. As discussed below the processor may be configured to communicate with a remote computer that may include a display that allows for remote monitoring and control by an administrator and alerts that provide information that relates to the status of the respective servers. Such communication may employ an Ethernet connection, USB connection, other cabling, or using wireless technology.

As best seen in FIG. 33, pin 1310 is also connected to the controller 1348 which can bring power and control signals from an external source. Contact member 1340 is on the opposite end of the cartridge 2166 from pin 1310. Contact member 1340 engages its adjacent side panel in order to complete a power circuit. The contact surfaces along the side surface and top interior surfaces are made of an elastomeric material and, when the cartridges are in an engaged position with the panel, an air tight seal is established wherein a cavity formed in the panel behind the cartridges can be pressurized.

Controller 1348 is attached to valves 2800. In an embodiment, sensor 1319 includes an infrared light source and photo detector and will send a signal to the controller 1348 reflecting the presence of absence of a server opposite the sensor. If a server is present, the valves will be opened. If no server is detected opposite the sensor, the valves remain closed.

Figure 34A:
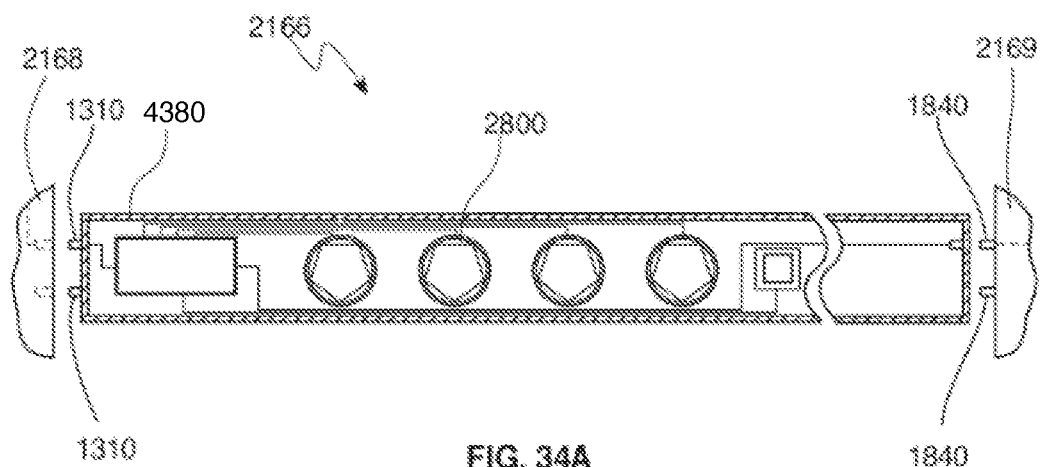
FIG. 34A is a side sectional fractional view of a cartridge according to an embodiment of the invention.
Figure 34B:
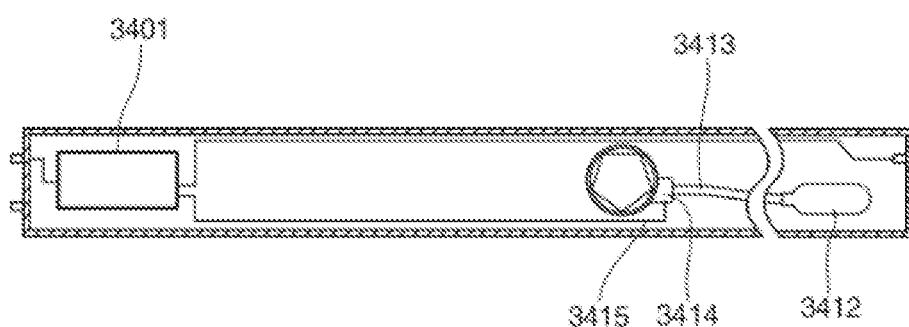
FIG. 34B is a side sectional fractional view of a cartridge according to a further embodiment of the invention.

Now referring to FIGS. 34A-34B, cartridge 2166 is shown opposite side members 2168 and 2169. FIG. 34B depicts a further embodiment wherein the cartridge 2166 includes a reservoir 3412 (not shown to scale) which contains an inert gas under pressure that can be used for fire suppression. Reservoir 3412 is connected to a valve 3414 by tubular passage 3413. Valve 3414 controls the regulation of the inert gas into one of the passageways through cartridge 2166. Valve 3414 is controlled by controller 3401 and, in embodiments, a temperature control sensor in communication with the central controller can send a signal indicative of temperature. The central controller is programmed to send a signal to local controller 3401 over wire 3415 when the temperature within a server has rapidly increased thereby reflecting a possible fire event.

FIG. 35 depicts air flow through an exemplary cartridge 2166 that includes valves 2800 in a partially-opened position.

As shown in FIG. 36 an alternative embodiment of the cartridge 2166 depicts cavity 3608 that may receive removable insert 3610 that functions to block airflow through the cartridge.

In a further embodiment, depicted in FIGS. 37 and 38 and cartridge 2166, a movable flap, e.g. a shutter 3709, is provided to regulate air flow. As depicted the shutter 3709 is mounted for pivotal movement and only allows flow through gap 3707. In embodiments shutter is 3709 is incrementally opened using a stepper motor that can incrementally adjust the position of the shutter and correspondingly incrementally adjust the size of the opening. In other embodiments the shutter can be manually adjusted. It is contemplated that this cartridge design may be used with a server that has corresponding rectangular passages on the lateral sidewall (not shown). Referring to FIG. 38, the shutter is depicted in a fully opened position and the gap or opening is defined by space 3809. In this position the air flow through the cartridge is maximized.

Figure 39:
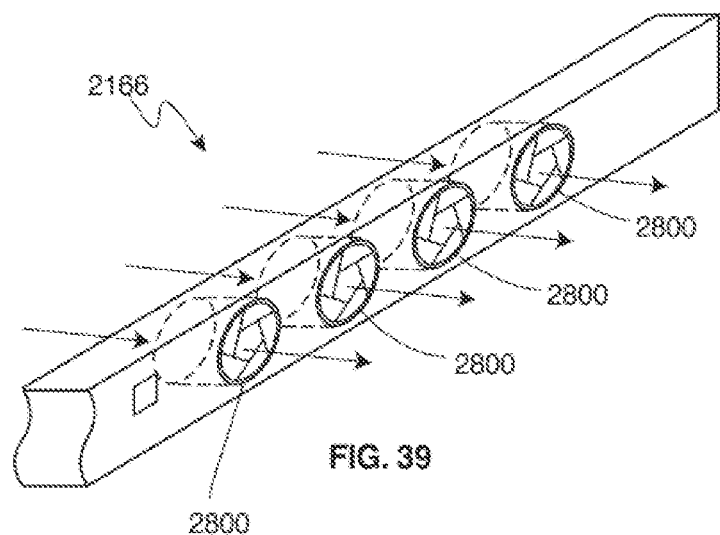
FIG. 39 is a perspective partial view of an alternative cartridge according to a further embodiment of the invention with iris valves in partially open position that schematically depicts air flow through the device.
Figure 40:
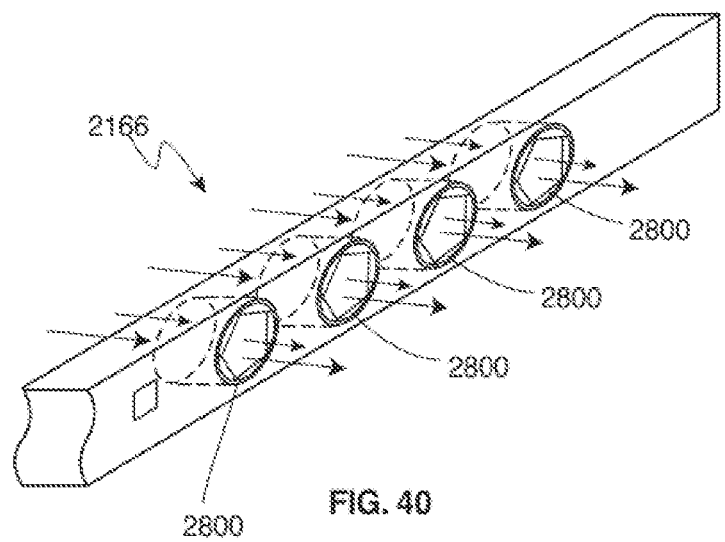
FIG. 40 is a perspective partial view of a cartridge according to the embodiment depicted in FIG. 39 with iris valves in fully open position and that schematically depicts air flow through the device.

FIG. 39 illustrates a fractional view of a cartridge 2166 having a series of valves 2800 in a partially open position and depicts the direction of airflow through the valves. FIG. 40 depicts valves 2800 in a fully open position wherein the air flow is increased.

Figure 41:
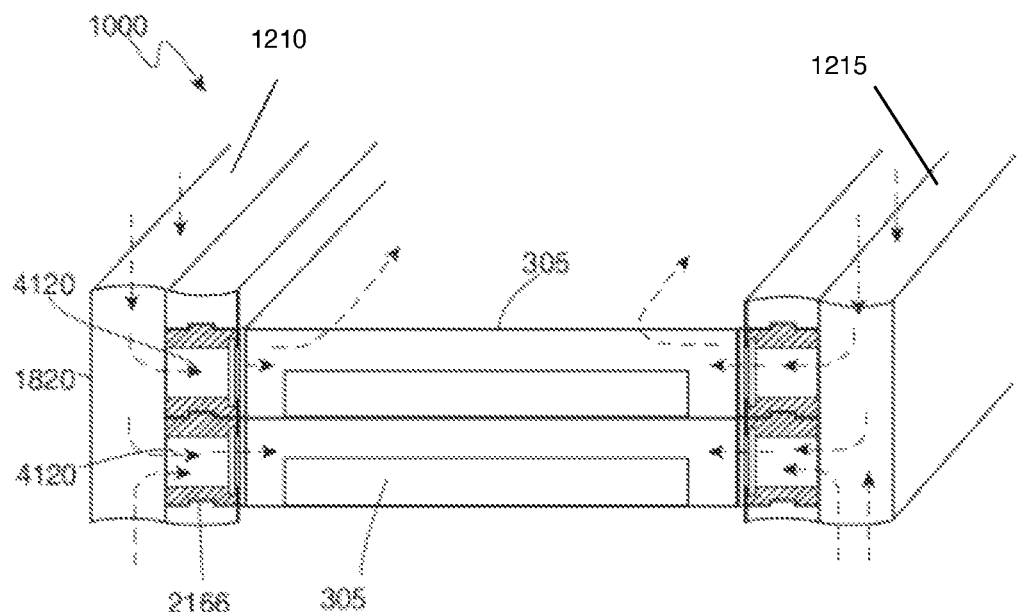
FIG. 41 is a perspective fractional front view of side panel members and servers that schematically depicts air flow through the device.

FIG. 41 is a sectional view of a front section of a rack system 1000 and server 305 depicting air flow first into the panel cavity section 1820 of panel 1210 from both the lower and upper directions. Air flows into passage 4120, through a rail section (not shown) and into server 305. Another flow path that is illustrated travels from the panel cavity 1820 through passage 4120 that is provided through cartridge 2166. Air introduced in the front of servers 305 cools components within the servers and flows rearward.

Figure 42:
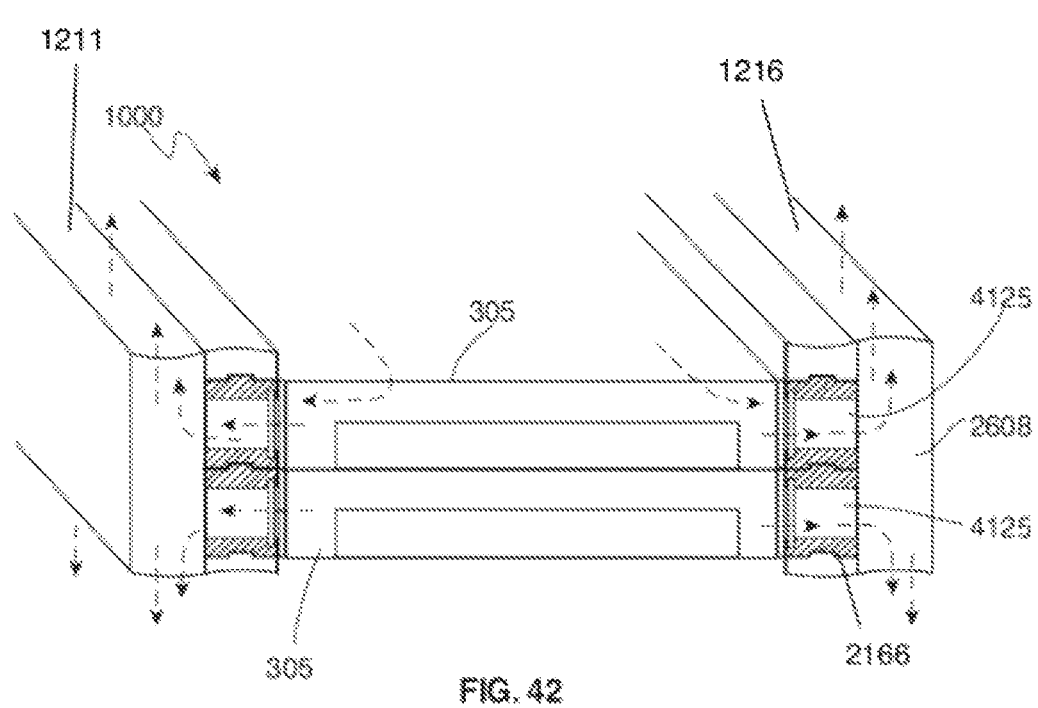
FIG. 42 is a perspective fractional rear view of side panel members and servers that schematically depicts air flow through the device.

As shown in FIG. 42, air flows from the front of server 305 passes through passage 4125 that is provided though cartridge 2166 and into panel cavity section 2608 of panels 1211 and 1216. From the rear cavity 2608 the air flows either upwardly or downwardly to the passages in the top and bottom of the rearward side panel section.

Figure 43A:
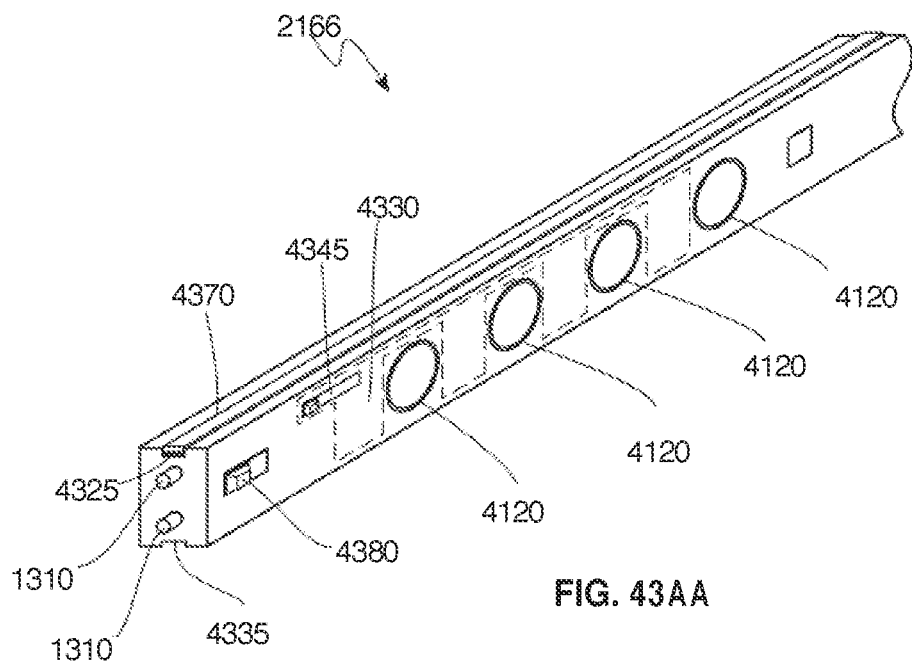
FIG. 43AA is a perspective partial view of a cartridge according to a further embodiment of the invention with a series of circular passages.
Figure 43A:
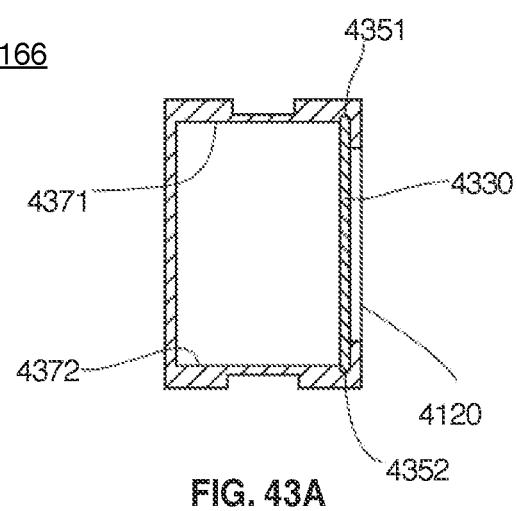

FIG. 43AA depicts an embodiment of a cartridge member 2166 having a plurality of passages 4120 depicted in an open position. In this embodiment there is a sealing member 4370 received in a groove 4325 provided along the top surface of the cartridge member 2166. Sealing member 4370 designed to engage the bottom surface of an adjacent cartridge or a top horizontal member of a panel and form an air tight seal. Sealing member 4370 can be raised and lowered via a mechanical connection with member 4380. When member 4380 is in the retracted position, pins 1310 will be retracted along with seal 4370 being lowered. When member 4380 is in the engaged position, pins 1310 will be moved forward and seal 4370 will be in the raised position. The bottom of the cartridge is also provided with a lower groove 4335 that can be received the top of a cartridge positioned under cartridge 4300. In this embodiment a flat blocking member 4330 is provided within the cartridge 2166 which can be controlled by engagement of member 4345 to laterally slide the member to block the passages and thereby impede the flow of air through the cartridge. In this embodiment pins 1310 are spring biased and can be retracted by sliding control lever 4380 in a lateral direction. Upon release of the lever, the pins may be received in opposite openings provided on the side panel members to retain the cartridge members in place.

In FIG. 43A, blocking member 4330 is depicted retained within opposite grooves 4351 and 4352 provided in the interior top surface 4371 and bottom interior surface 4372 of the cartridge 2166 and engaged to allow for movement within the grooves.

Figure 43B:
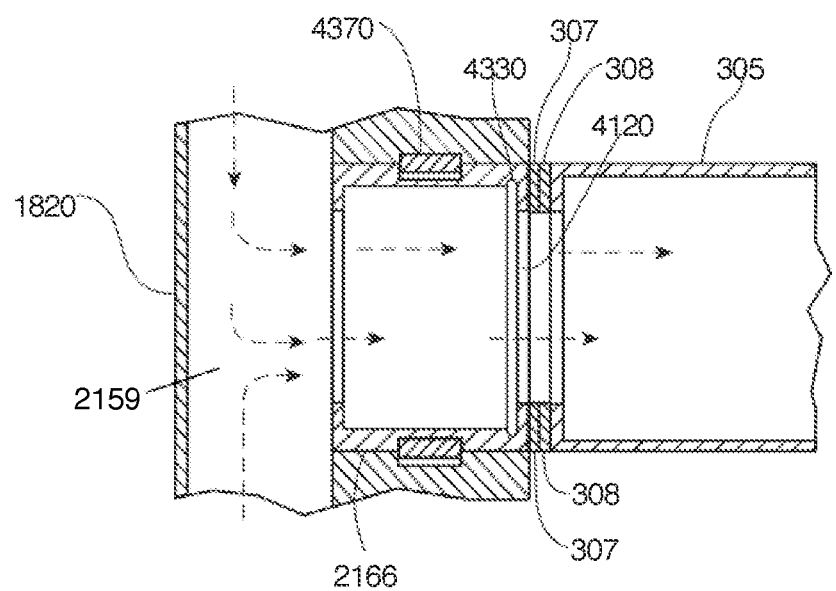
FIG. 43B is a sectional view of a forward panel, a cartridge rail and server that illustrates the direction of airflow through the elements.

FIG. 43B depicts a sectional view of rack assembly invention 1000. Void region 2159 is defined between a cartridge assembly 2166 and planar sheet member of panel section 1210 through which air flows into the rear of cartridge 2166. The cartridge includes a top sealing member 4370 that is comprised of a resilient material which is provided to assist with forming a seal with an adjacent cartridge. The air flow is interfered by member 4330 which will slide to open and close a passage 4120 that allows air flow to server 305. The rail member is depicted as two part member 307 and 308 through which is provided with a passage to allow for air flow from cartridge 2166 to server 305.

Figure 43C:
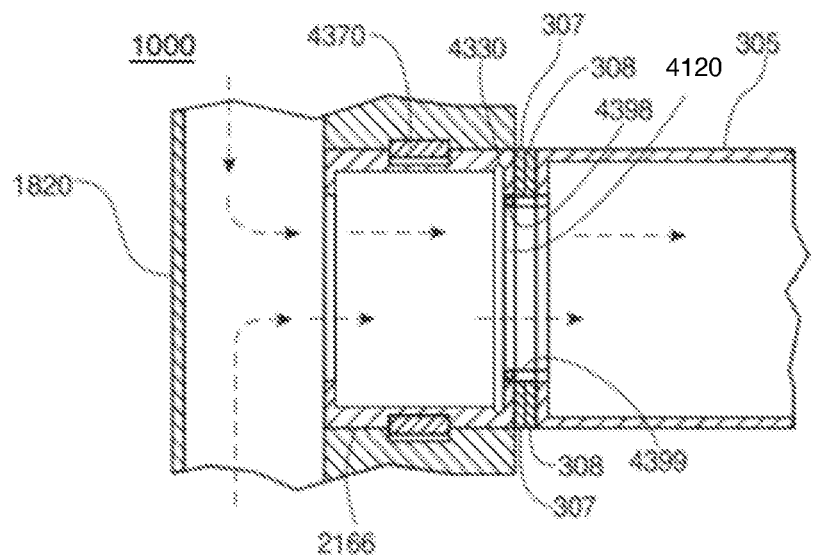
FIG. 43C is a sectional view of a forward panel, a cartridge, a rail and server that illustrates the direction of airflow through the elements according to a further embodiment of the invention.

FIG. 43C depicts a further embodiment that include annular seal ring member 4398. In this embodiment an annular fabric shroud 4399 will axially extend from the annular ring 4398 provided at the junction of air passages and, in response to air flow, shroud 4399 is radially displaced to seal the junction between the components. As such when air flows, the shroud fills the gap between the cartridge 2166, rail members 307 and 308, and server 305.

Figure 43D:
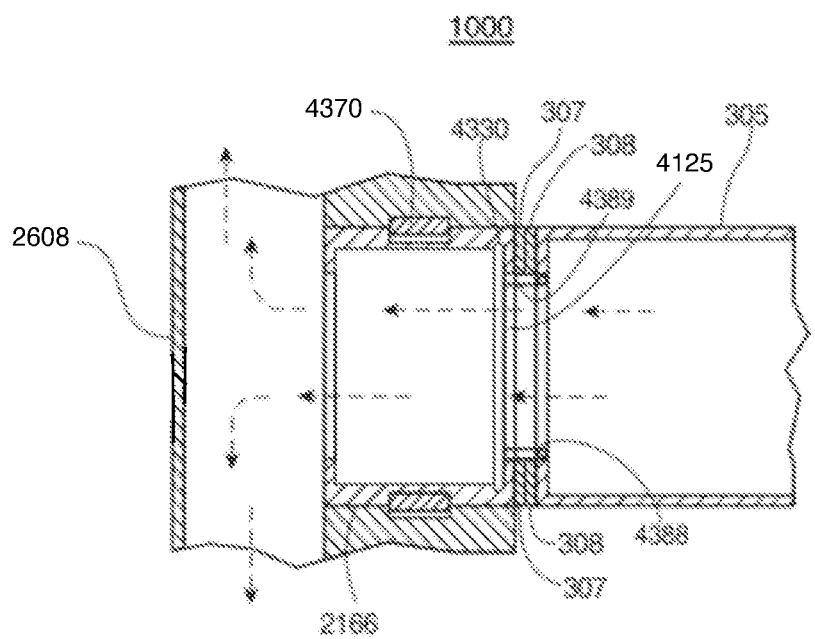
FIG. 43D is a sectional view of a rearward panel, a cartridge, a rail and server that illustrates the direction of airflow through the elements according to an embodiment of the invention.

FIG. 43D schematically depicts air flow from server 305 to a rear panel. Like the embodiment depicted in FIG. 43C, the embodiment includes annular seal member 4388 and shroud member 4389 that, in response to air flow is displaced to minimize the air loss through the interface between server 305, rail members 307 and 308 and cartridge 2166.

Figure 44:
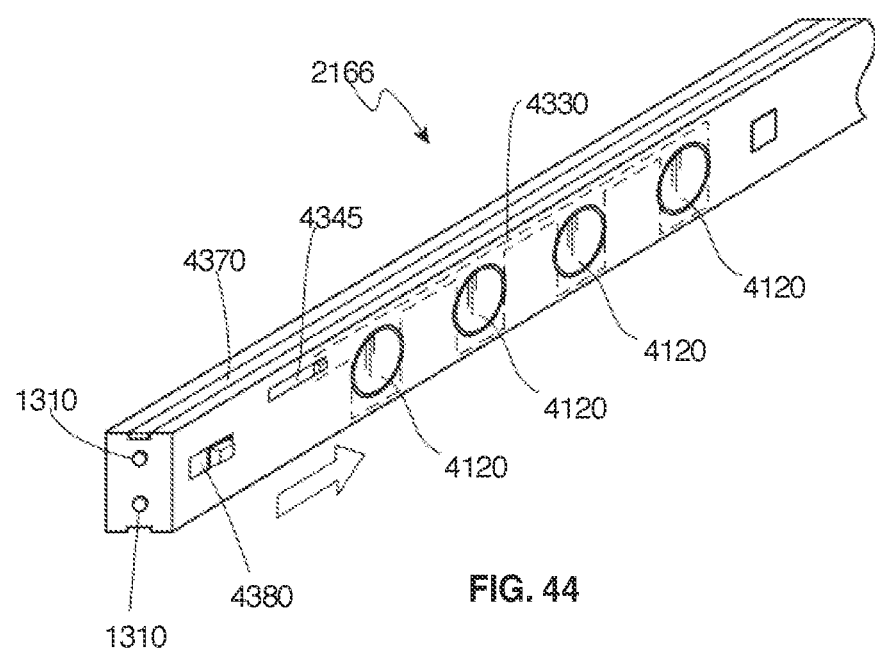
FIG. 44 is a perspective partial view of a cartridge according to the embodiment of 43 with the passages obstructed.

FIG. 44 depicts cartridge 2166 wherein the blocking member 4330 has been moved to close the passages 4120 and the pins 1310 are depicted in a retracted position. In embodiments, the seal is mechanically lifted by rotation of a cam member that alternatively lowers and raises a seal member such as seal member 4370. In yet alternative embodiments, the resilient seal member 4370 is spring biased and can be displaced downwardly upon assembly. In yet further embodiments, a mechanical switch is provided that lifts and mechanically locks the resilient member by lateral movement of a switch extension that is accessible through an L shaped opening.

Figure 45:
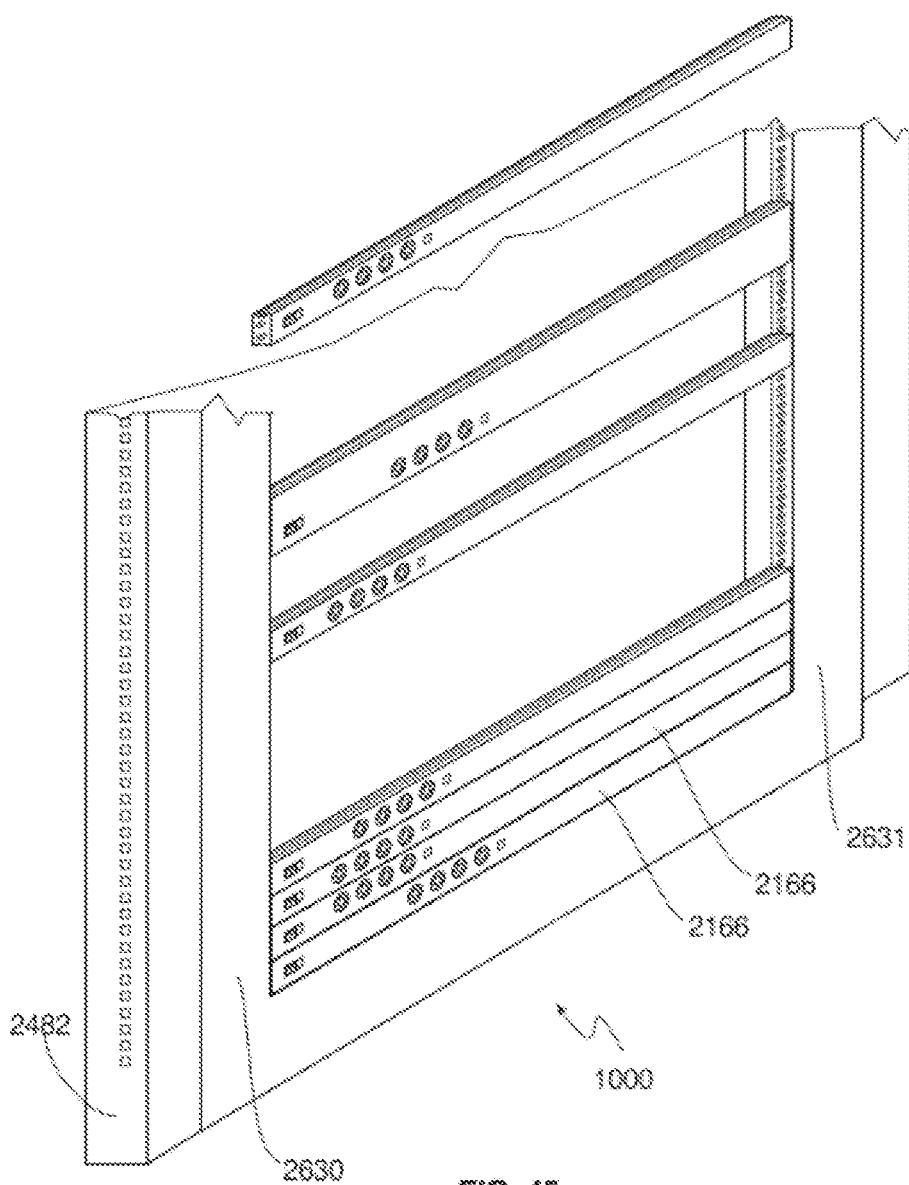
FIG. 45 is a perspective fractional view of a forward side panel depicting a plurality of different cartridges.

FIG. 45 illustrates a side panel assembly 1210 including a plurality of cartridges such as cartridges 2166 that span upright member 2630 and upright member 2631. The rear surface of the cartridges define a front surface of an internal cavity of the panel. Adjacent to upright member 2630 is an upright front post member 2482 that is provided to support the servers and rails of the device.

Figure 46:
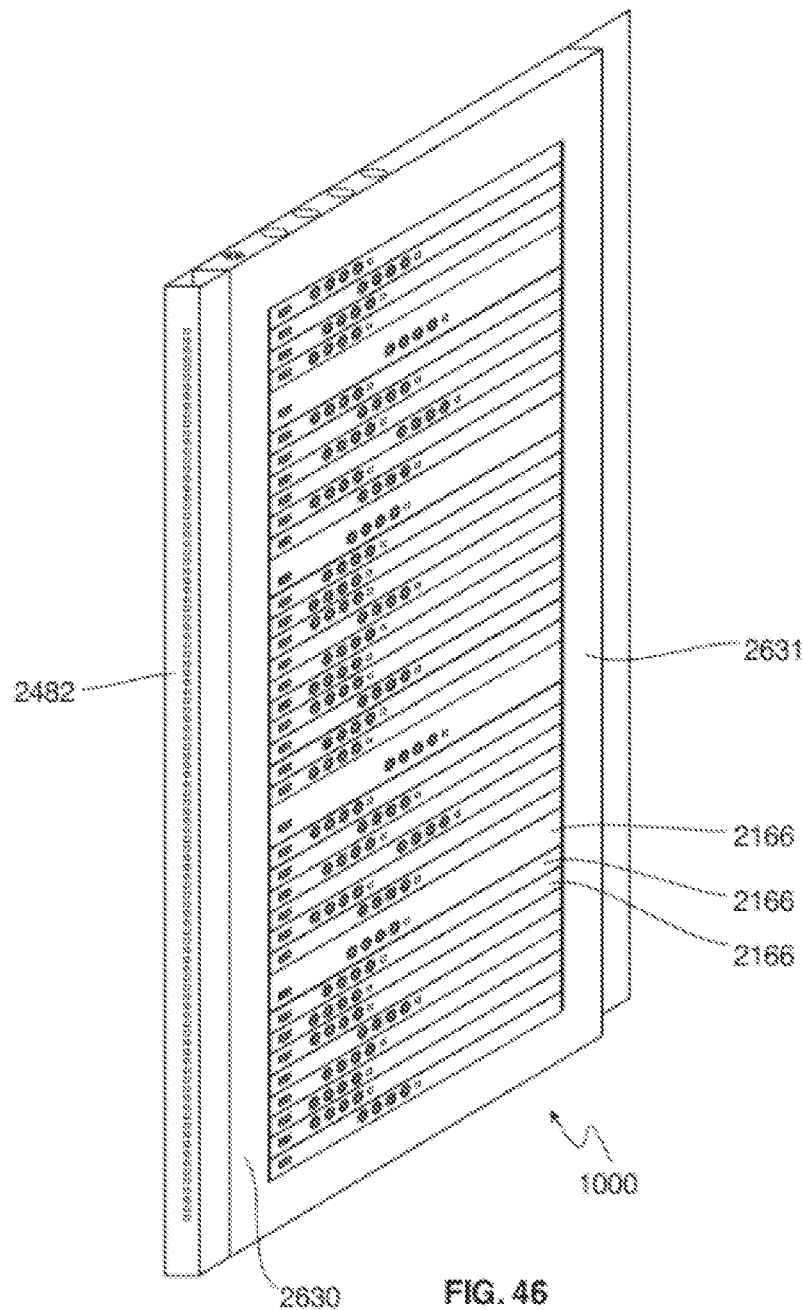
FIG. 46 is a perspective view of a forward side panel depicting a plurality of different cartridges.

FIG. 46 depicts a completely assembled forward panel including upright front post upright member 2482, section and cartridges such as 2166 placed between the section vertical supports 2630, 2631.

Figures 47, 48:
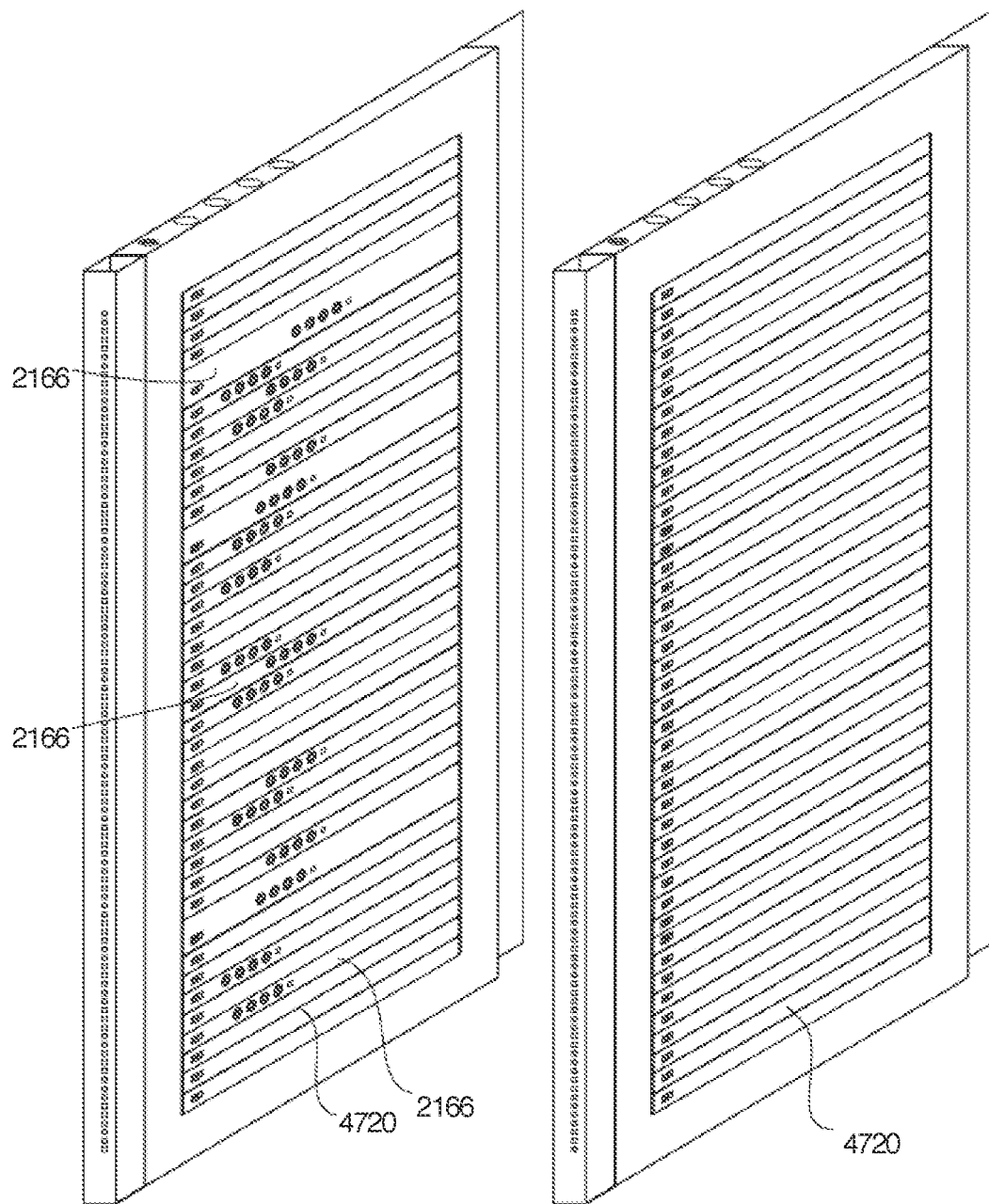
FIG. 47 is a perspective view of a forward side panel in an alternative embodiment depicting a plurality of different cartridges.
FIG. 48 is a perspective view of a forward side panel depicting a plurality of different cartridges that are all devoid of passages.

FIG. 47 depicts an alternative assembly that includes a number of cartridges 4720 that are devoid of valves and passages.

FIG. 48 depicts a further alternative assembly where the cartridges that were selected include no valves or passages. Thus FIGS. 47 and 48 illustrate alternative configurations of cartridges 2166 and blanks 4720 that may be used with the invention.

As best seen in FIG. 47, the cartridges may have different vertical dimensions to conform to the vertical dimension of a server. In addition, in embodiments cartridges may have different lateral placement of the iris valves and passages to conform to the needs of differing servers and network equipment.

Figure 49:
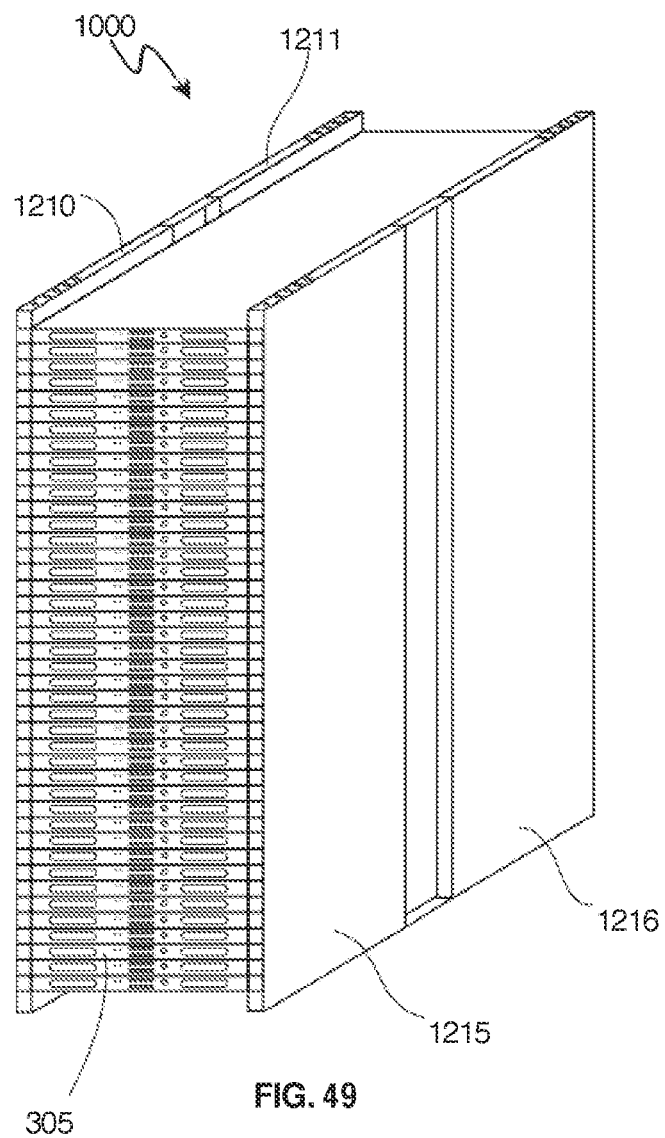
FIG. 49 is a perspective view of an embodiment of the rack according to the invention with a full complement of servers.

FIG. 49 depicts a server assembly 1000 with a full complement of single rack unit servers 305.

Figure 50:
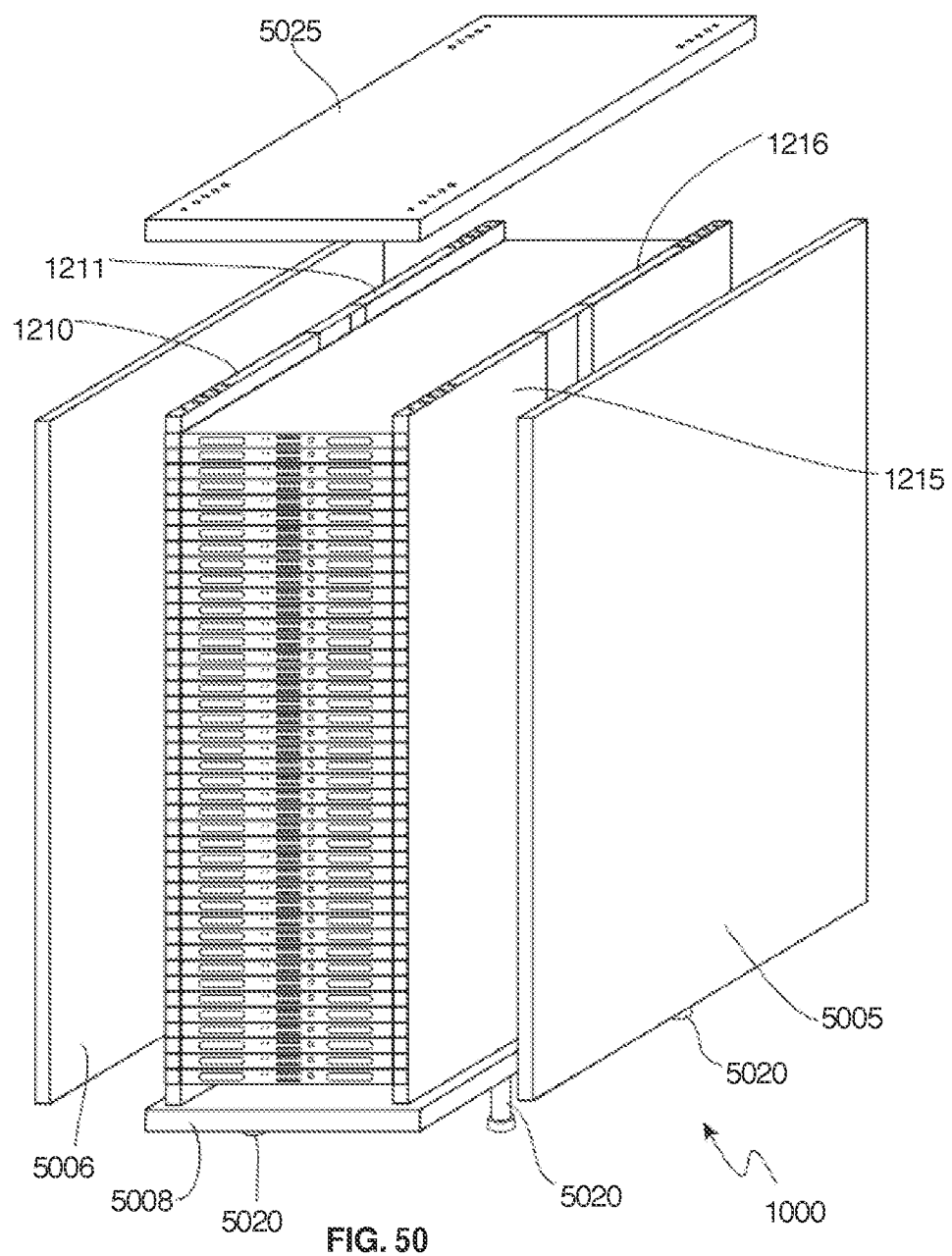
FIG. 50 is a perspective exploded view of an embodiment of the rack of the invention and depicting external paneling.

As shown in FIG. 50, the server rack assembly and servers are optionally enclosed in a cabinet that includes side exterior panels 5005 and 5006, top exterior panel 5025 and bottom exterior panel 5008. All of the quarter panels are attached to an intermediate frame to be fully supported. The entire rack is elevated from a support surface by legs 5020 or, alternatively, on casters. The top panel is provided with passages that allow air to flow to the forward panels 1210, 1215 and rearward panels 1211, 1216 that is contained within exterior panels. Additional passages, not pictured, may be added to exterior panels 5008 and 5025 for power, network cables, and other cabling.

Figure 51:
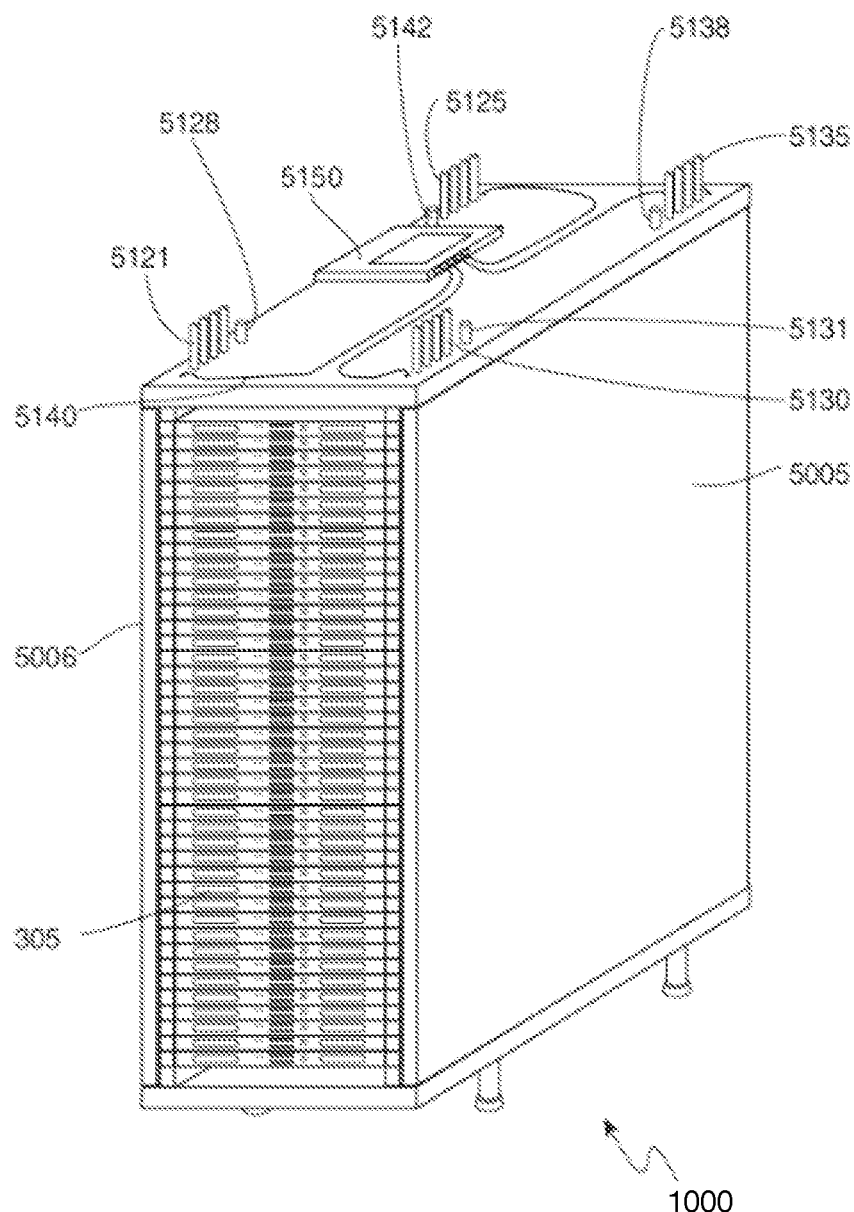
FIG. 51 is a perspective view of an embodiment of the invention depicting a controller and external paneling.

Referring now to FIG. 51, an assembled rack system 1000 includes exterior side panels 5005 and 5006 that contain the side forward panels and rearward side panels. In embodiments, there are front and rear doors provided that can be used to close and lock the whole rack. In further embodiments, the panels used are insulated. Again referring to FIG. 51, the top of the device includes front top passages 5121 and 5130 that communicate with the forward lateral side panels. Next to the inlet passages 5121 and 5130 are pressure relief valves 5128 and 5131. When the pressure in the system exceeds a predetermined pressure, the valves will release air to the atmosphere and prevent damage to components of the system. Similar pressure relief valves 5138 and 5142 are located in the rear panel adjacent to rear top passages 5125, 5135. On the top of the panel is a controller 5150 that is in communication with the cartridges via wires 5140.

Figure 52:
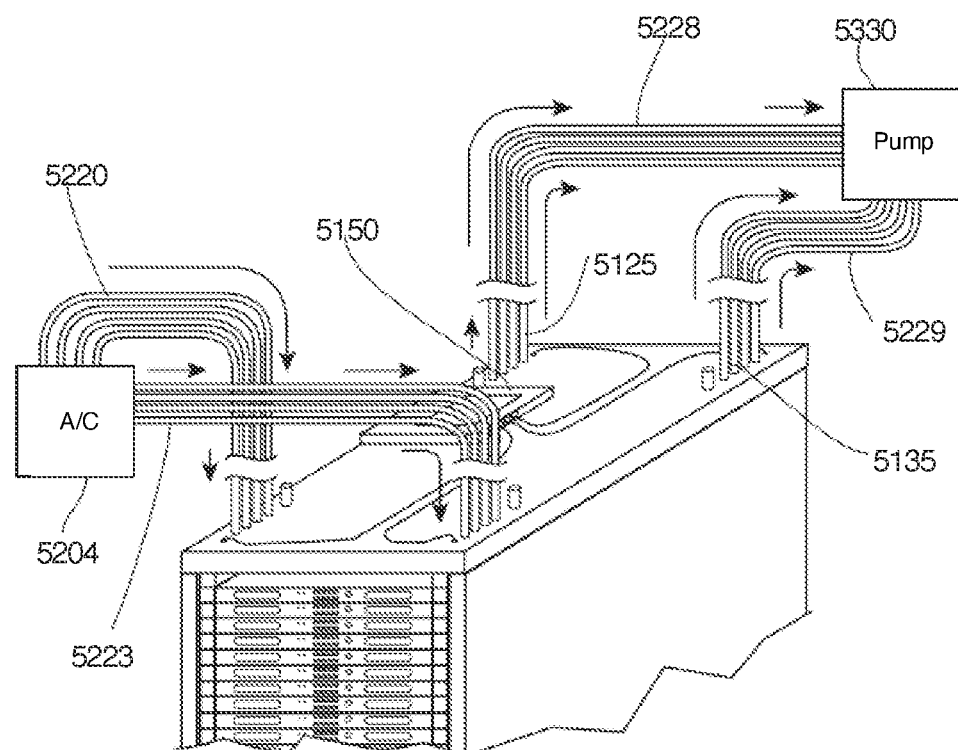
FIG. 52 is a perspective fractional top view of an embodiment of the invention with an air conditioner and air pump system with a schematic representation of an air flow system.

A top view of a building rack device system 1000 is depicted in FIG. 52 that includes an air conditioner 5204 that provides cool air to top inlet passages in forward panels through conduits 5220, 5223. Air, after it has passed through a server, flows to the rearward panels and may exit through top passages 5125, 5135. Air exiting the panels is then directed through conduits 5228 and 5229 to pump 5330 that maintains negative pressure in the exhaust system and moves the air from the forward panels, through the servers and out to the rearward panels. Air from the pump may be transferred back to the air conditioner through passages (not shown) for recirculation through the system.

Figure 53:
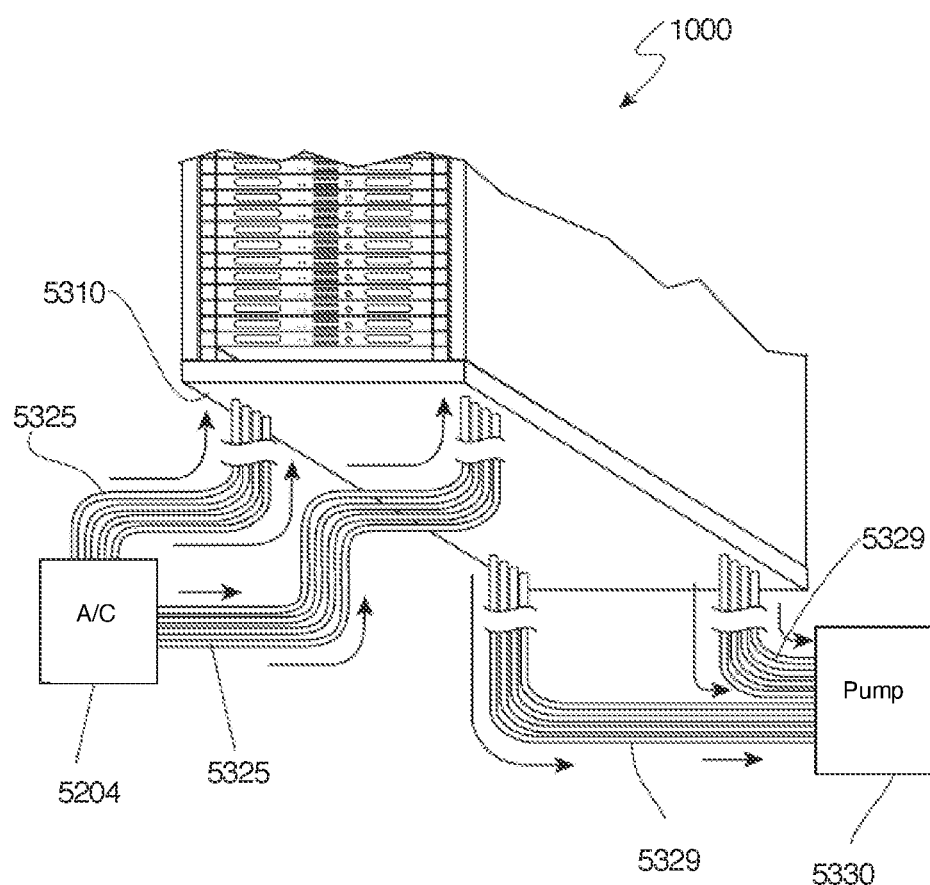
FIG. 53 is a perspective fractional bottom view of an embodiment of the invention with a schematic representation of an air flow system with an air conditioner and air pump system.

As shown in FIG. 53 the bottom surface 5310 of a rack system 1000 receives cool air from air conditioner 5204 from conduits 5325. Air is vented from the system through conduits 5329. A pump 5330 is provided that creates and maintains negative pressure in the exhaust air flow system and may transfer air back through passages (not shown) to the air conditioner.

In embodiments, the system includes a controller and servo motor that can adjust the flow parameters depending on the temperature of the server or group of servers. In further embodiments, the system includes a control board that includes a small circuit board with an Ethernet communications port for communication with the servers, a valve controller, air conditioner, heat pump, and a remote central monitoring and control location.

Referring now to FIG. 54, in a further embodiment 1000 air is directed from a cartridge member 2166 to openings provided in the front panel 5412 of server 305 using flexible tubular conduit members 5122. The depiction includes panels 1210, 1211 that receive the cartridges that are described herein. FIG. 55 depicts a top view of the system described above and includes the flexible conduit tubes 5122 that are depicted extending past the front edge 5417 of the server.

Figure 58:
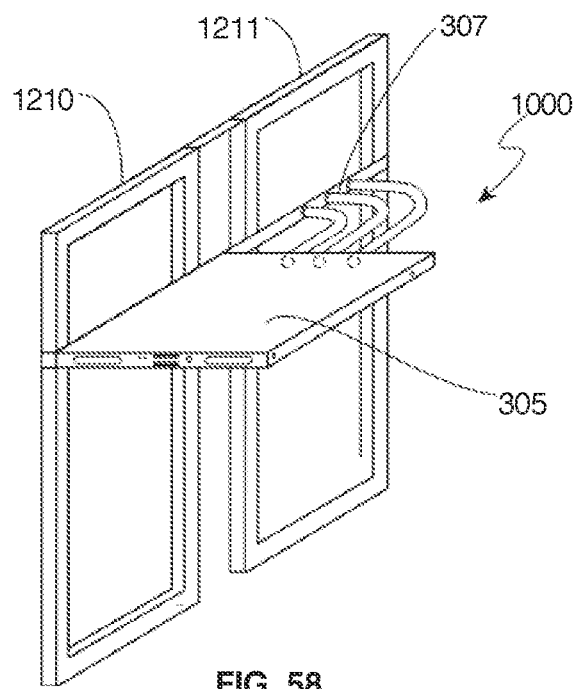
FIG. 58 is a perspective fractional front view of an embodiment of the invention wherein air is delivered from the rear of a server to a rear cartridge using a flexible hose.
Figure 59:
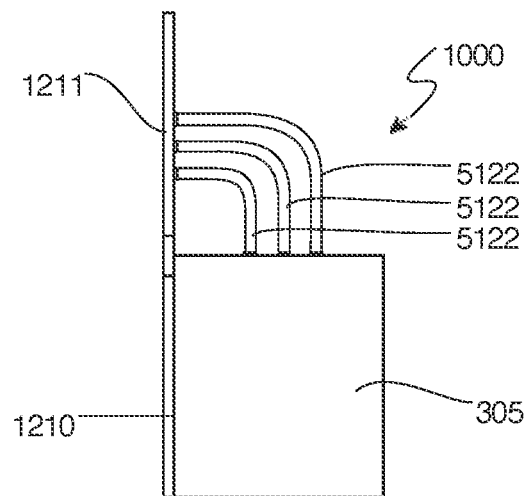
FIG. 59 is a top view of the embodiment depicted in FIG. 58.

In another embodiment of the invention that is depicted in FIG. 56, air is distributed from cartridge member 2166 through flexible tubular members 5122 to openings on the top of a server 305. In this embodiment, server 305 only extends one half the distance of the server rack. FIG. 57, a top view of the embodiment depicted in FIG. 56, shows conduits that extend from the lateral panel 1210 to the top of server 305. Now referring to FIG. 58, a further aspect of the invention is depicted wherein air is removed or vented from the rear of server 305 using flexible conduit hoses or tubular members to cartridge 2166 in rear panel 1211. As seen in FIG. 59, the air is directed from server 305 to the rear panel section 1211 using tubular members 5122.

Figure 60:
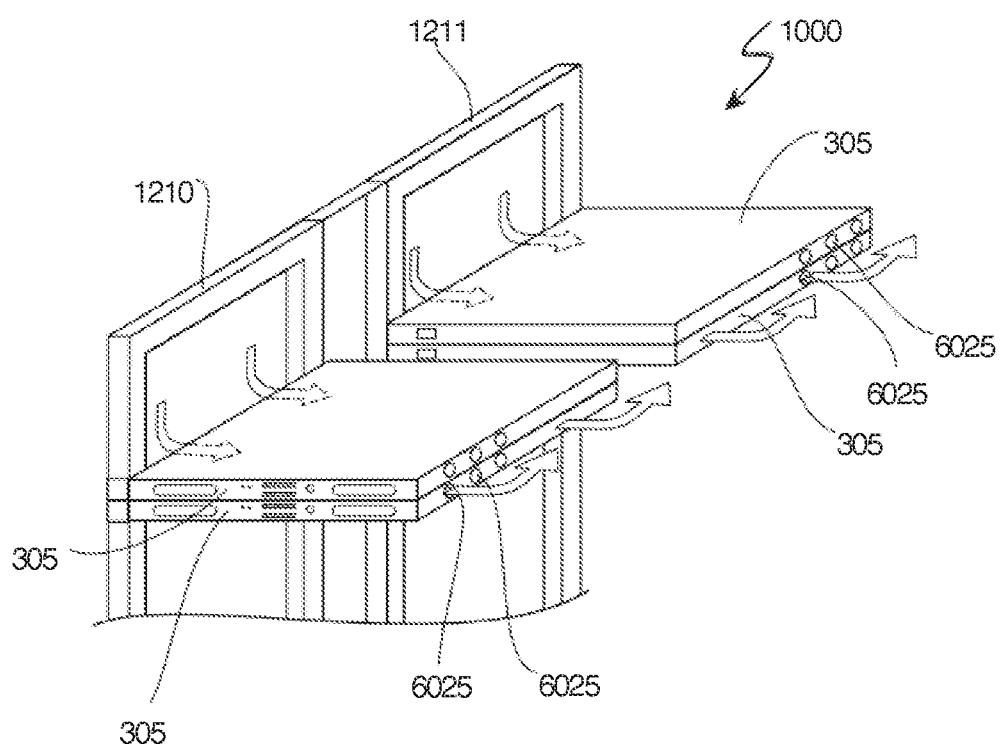
FIG. 60 is a perspective view of a further embodiment that uses two servers in a single rack unit and an alternative air flow configuration.

FIG. 60 depicts a schematic representation of an alternative air flow arrangement in a further embodiment of the invention 1000. In this embodiment servers 305 are attached to the same vertical location that is in turn attached to the front side panel 1210 and rear side panel 1211. Also shown are servers 305 that are also attached to the front side panel opposite 1210 and rear side panel opposite 1211 using conventional rack mount hardware. Air from cartridges provided in the front panel 1210 and rear panel 1211 flows laterally into the servers 305 and exits the servers through openings such as openings 6025. The openings are on the opposite sides of the servers and passages on cartridges (not shown) provided on lateral panels (not shown) that are opposite panels 1210 and 1211 and which receive from the servers and distribute the air out of the panels.

Figure 61:
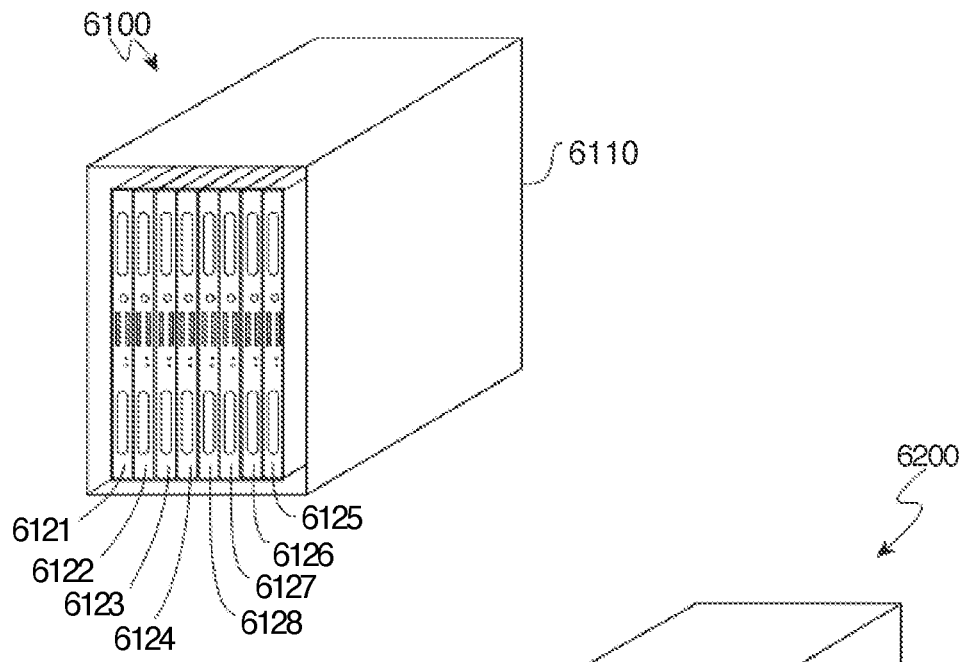
FIG. 61 is a perspective view of a plurality of blade servers according to prior art.

FIG. 61 is a depiction of prior art blade server system 6100 wherein a plurality of server blades 6121, 6122, 6123, 6124, 6125, 6126, 6127 and 6128 are oriented in a vertical direction and contained in an external housing 6110. External housing 6110 is designed to be received in server rack.

Figure 62:
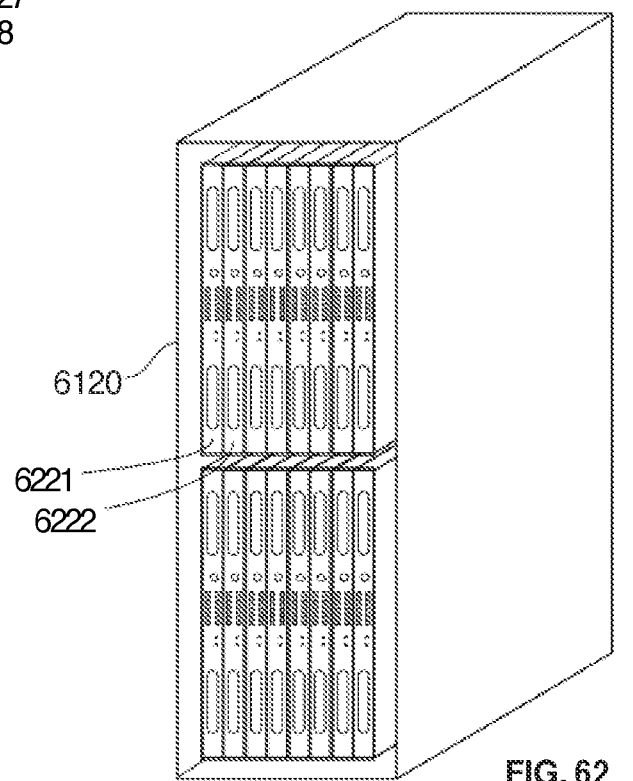
FIG. 62 is a perspective view of an alternative arrangement of blade servers according to the prior art.

FIG. 62 depicts a further alternative wherein an external housing 6120 encloses a plurality of servers such as 6221 and 6222. Blade server system 6200 includes two rows of vertically oriented servers.

Figure 63:
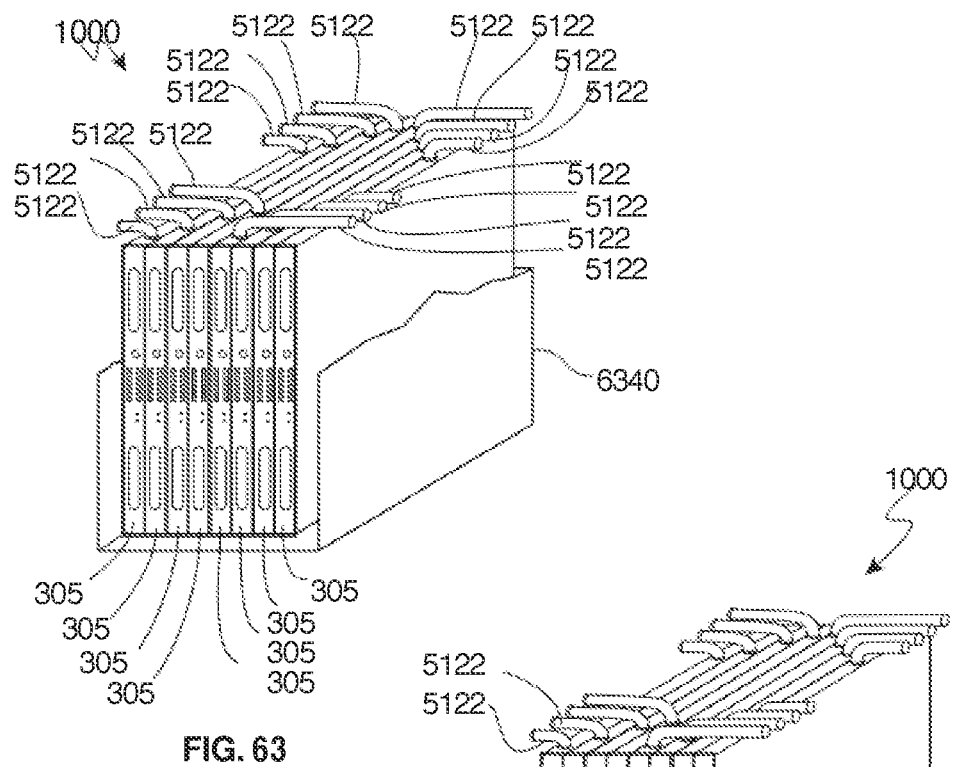
FIG. 63 is a front perspective fractional view of a chassis containing a number of blade servers according to an embodiment of the invention.

FIG. 63 depicts an embodiment of the invention 1000 adapted to provide cool air to and remove air from vertically oriented blade servers. Here, conduit 5122 is connected to a cartridge according to one of the embodiments of the invention discussed above and direct air to an opening provided on the top surface of server 305. Air is removed from server 305 using hollow tubular conduit 5122 which is directed air to a cartridge provided in rearward lateral panel as described above. FIG. 63 therefore depicts a server device in which each of the servers 305 are provided with air flow to and from the server. These conduits 5122 pass through the external casing 6340 that retains the servers and then direct the air laterally.

Figure 64:
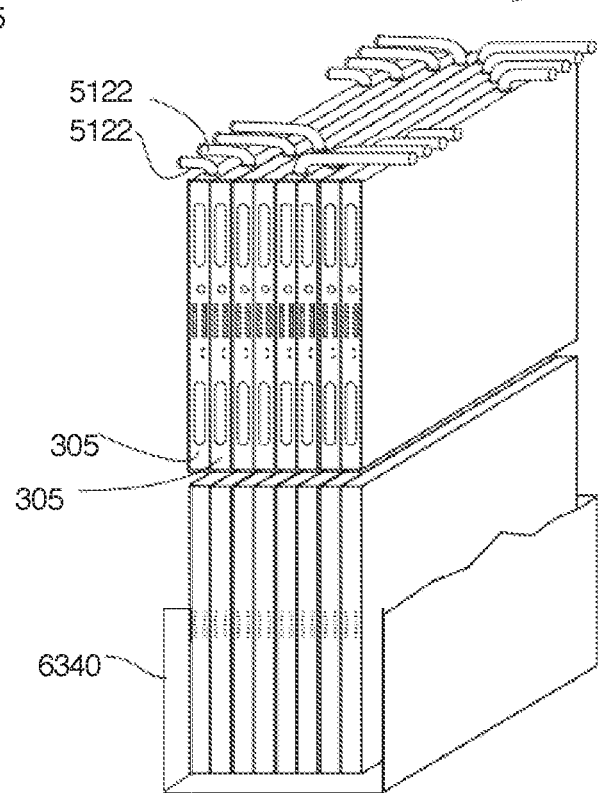
FIG. 64 is a front perspective fractional view of a chassis containing a number of blade servers in multiple rows.

FIG. 64 depicts a further embodiment 1000 wherein hollow tubular cooling conduits 5122 provide airflow into servers 305. Air is removed from the servers in a similar manner as described with respect to the embodiment 1000 depicted herein.

FIG. 65 depicts a blade server arrangement 1000 wherein air is distributed to servers through openings on their bottom surfaces through tubular conduits 5122. Air is removed from the servers 305 using tubular conduits 5122 and is directed laterally wherein it can be received by cartridge members as described herein provided on lateral panels.

In a further embodiment 1000 depicted in FIG. 66, a row of blade servers 305 includes multiple rows of servers oriented vertically. Air is provided to servers on a lower row using through tubular conduits such as 5122. These conduits provide air flow from lateral sides of the device 1000 and deliver the air to the bottom surface of severs. Air is removed from the servers using similar conduits and directed laterally.

In further embodiments (not shown), fans are provided in the cartridges to assist with air flow to the servers and to assist with the removal of air from the servers. In yet other embodiments the fans may be provided in connection with the intake openings and exhaust opening in the panels, or along the conduits that provide for air handling to and from the panels.

Figure 67:
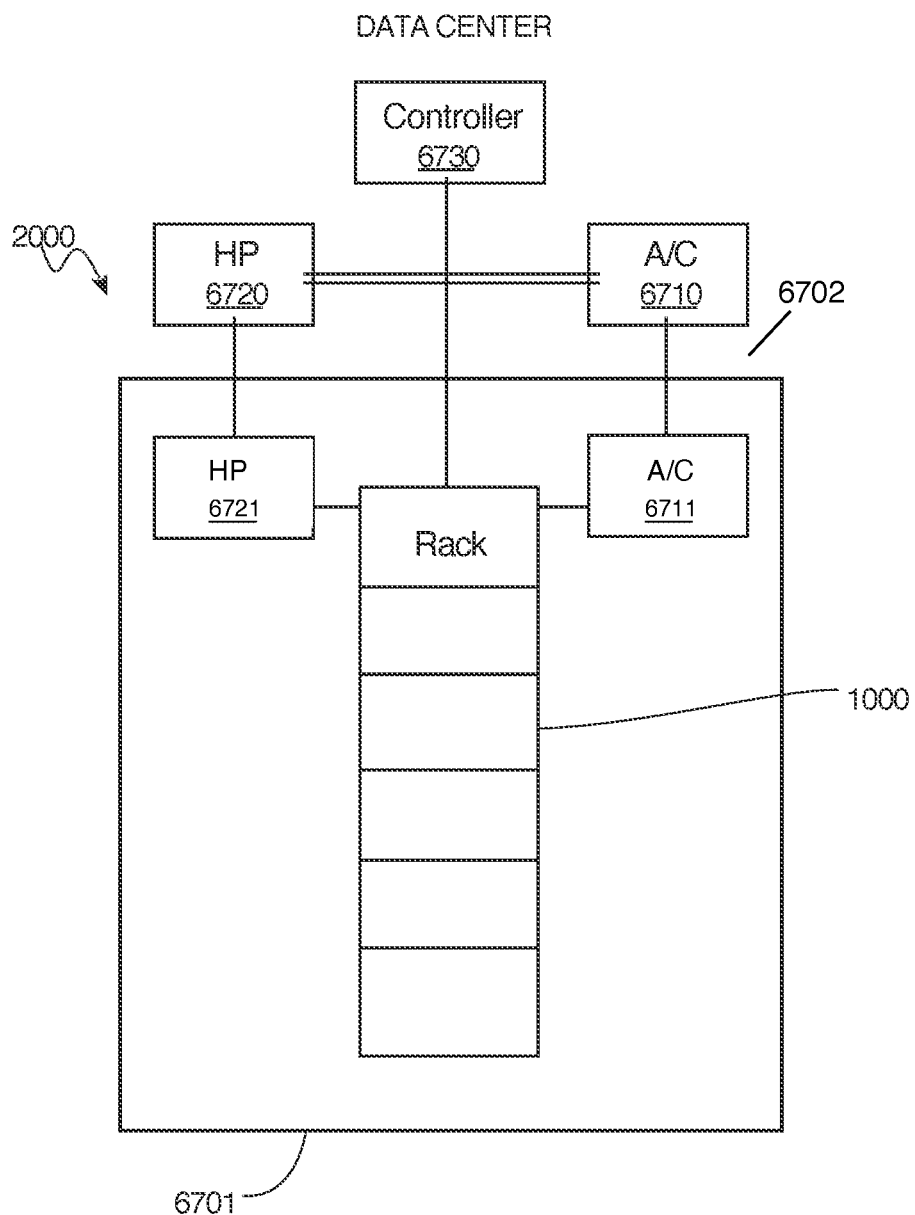
FIG. 67 is a schematic illustration of a system used according in connection with a data center.

FIG. 67 is a schematic view of a data center building embodiment 2000 wherein a plurality of racks 1000 are positioned in a building structure 6701 and exterior 6702 to constitute a server facility or data center. The data center includes a central controller 6730 that may be in proximity to the data center or in remote communication. The system optionally includes an air conditioner system that includes conventional exterior components 6710 such as a compressor, condenser element and a fan and interior components 6711 that include fans, evaporator coils, and an expansion device for the coolant used in the system. The system may also include heat pump (HP) technology including interior components 6721 which may include a blower, an expansion device, and an exterior coil and conventional exterior components 6720 including a compressor, check valves, an expansion device, exterior coils and a fan.

In yet further embodiments, a variety of rails members are provided in connection with the rack systems to receive different server models, wherein the rails have different designs with different passages to complement the passages in different servers.

Although the present invention has been described in considerable detail with reference to certain preferred versions thereof, other versions would be readily apparent to those of ordinary skill in the art. Therefore, the spirit and scope of the appended claims should not be limited to the description of the preferred versions contained herein.

INDUSTRIAL APPLICABILITY

The present invention permits the efficient cooling of computer equipment, particularly aggregated computer equipment confined to enclosed spaces. The power use of server farms, co-location facilities, and other data centers that specialize in providing computation and storage availability are using a sizeable percentage of available electricity. Much of this power use is related, not only to operating the computer equipment, but also cooling the computer equipment. The present invention represents a substantial advance in the effectiveness of cooling this equipment in way that does not require the substantial modifications to facilities, and allows a modular and upgradable solution.

What is claimed is:

1. An apparatus, comprising:
a means for holding a computer, the computer having a case, the case with an airflow inlet opening and an airflow outlet opening, the means for holding including an airflow inlet passage and an airflow outlet passage, the airflow inlet passage and an airflow outlet passage in at least one sidewall of said means for holding;
a means for releasably affixing the case of the computer to the means for holding, the means for releasably affixing having an airflow inlet channel and an airflow outlet channel, the means for releasably affixing configured to extend out of and retract into the means for holding the computer in order to translate the computer into and out of the means for holding the computer;
a first means for obstructing an input fluid passing from the means for holding to the case of the computer, the first means for obstructing the input fluid having a range of motion selected from a group including a fully open position, a partially open position, and a closed position;
a second means for obstructing an exhaust fluid passing from the case of the computer to the means for holding, the second means for obstructing the exhaust fluid having a range of motion selected from a group including a fully open position, a partially open position, and a closed position,
wherein the airflow inlet passage of the means for holding, the airflow inlet channel of the means for releasably affixing and the airflow inlet opening of the case being in fluid communication when the case is releasably affixed to the means for releasably affixing and the first means for obstructing the input fluid is not in the closed position,
wherein the airflow outlet passage of the means for holding, the airflow outlet channel of the means for releasably affixing and the airflow outlet opening of the case being in fluid communication when the case is releasably affixed to the means for releasably affixing and the second means for obstructing the exhaust fluid is not in the closed position, and
wherein the airflow inlet passage in the at least one sidewall of the means for holding is adapted to allow passage of the input fluid into the case of the computer, and the airflow outlet passage in the at least one sidewall of the means for holding is adapted to allow passage of the exhaust fluid from the case of the computer.

2. The apparatus of claim 1, further comprising:
a means for controlling operatively coupled to the first means for obstructing the input fluid, the means for controlling configured to send a signal to the first means for obstructing the input fluid to cause the first means for obstructing the input fluid to change a position within the range of motion of the first means for obstructing fluid.

3. The apparatus of claim 1, further comprising:
a means for measuring a temperature of the computer during operation of the computer; and
a means for controlling operatively coupled to the first means for obstructing the input fluid and the means for measuring,
wherein the means for controlling configured to send, based on the temperature of the computer, a signal to the first means for obstructing the input fluid to cause the first means for obstructing the input fluid to change a position within its said range of motion of the first means for obstructing the input fluid in response to the signal.

4. The apparatus of claim 1, further comprising:
a means for measuring a temperature of the computer during operation of the computer; and
a means for controlling operatively coupled to the second means for obstructing the exhaust fluid and the means for measuring,
wherein the means for controlling configured to send, based on the temperature of the computer, a signal to the second means for obstructing the exhaust fluid to cause the second means for obstructing the exhaust fluid to change a position within said range of motion of the second means for obstructing the exhaust fluid in response to the signal.

5. The apparatus of claim 1, further comprising:
a means for sealing passing through the means for releasably affixing and the case, the means for sealing being elastically deformable and exteriorly circumscribing a junction of the airflow inlet channel of said means for releasably affixing and the airflow inlet opening of the case.

6. The apparatus of claim 1, wherein the apparatus further comprises:
a first means for sealing adapted to prevent fluid communication between the airflow inlet passage of the means for holding and a building housing said apparatus; and
a second means for sealing adapted to prevent fluid communication between the airflow outlet passage of the means for holding and said building.

\* \* \* \* \*